United States Patent
Yamazaki et al.

(10) Patent No.: US 12,160,675 B2
(45) Date of Patent: Dec. 3, 2024

(54) SOLID-STATE IMAGING ELEMENT AND IMAGING APPARATUS

(71) Applicant: Sony Semiconductor Solutions Corporation, Kanagawa (JP)

(72) Inventors: Tomohiro Yamazaki, Kanagawa (JP); Yoshinori Muramatsu, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 272 days.

(21) Appl. No.: 17/780,189

(22) PCT Filed: Dec. 11, 2020

(86) PCT No.: PCT/JP2020/046211
§ 371 (c)(1),
(2) Date: May 26, 2022

(87) PCT Pub. No.: WO2021/131771
PCT Pub. Date: Jul. 1, 2021

(65) Prior Publication Data
US 2022/0417463 A1 Dec. 29, 2022

(30) Foreign Application Priority Data
Dec. 26, 2019 (JP) .................................. 2019-236962

(51) Int. Cl.
*H04N 25/768* (2023.01)
*H04N 25/53* (2023.01)
(Continued)

(52) U.S. Cl.
CPC ........... *H04N 25/768* (2023.01); *H04N 25/53* (2023.01); *H04N 25/75* (2023.01); *H04N 25/778* (2023.01)

(58) Field of Classification Search
None
See application file for complete search history.

(56) References Cited

U.S. PATENT DOCUMENTS
2018/0204867 A1* 7/2018 Kim .................... H01L 24/80

FOREIGN PATENT DOCUMENTS
JP 2014-510447 A 4/2014
JP 2018-186478 A 11/2018
(Continued)

OTHER PUBLICATIONS
International Search Report (PCT/ISA/210), International Application No. PCT/JP2020/046211, dated Mar. 9, 2021.

*Primary Examiner* — Mark T Monk
(74) *Attorney, Agent, or Firm* — Michael Best & Friedrich LLP

(57) ABSTRACT

Pixel sensitivity is improved in a solid-state imaging element that performs time delay integration. The solid-state imaging element includes a plurality of photoelectric conversion elements and a given number of transistors. In the solid-state imaging element, the plurality of photoelectric conversion elements is arranged along a given direction with a given spacing. A size, in the given direction, of each of the plurality of photoelectric conversion elements that are arranged with the given spacing does not exceed the given spacing. Also, in the solid-state imaging element, the given number of transistors are arranged between the plurality of photoelectric conversion elements, and the transistors generate a signal commensurate with an amount of charge generated by any of the plurality of photoelectric conversion elements.

12 Claims, 17 Drawing Sheets

(51) Int. Cl.
*H04N 25/75* (2023.01)
*H04N 25/778* (2023.01)

(56) References Cited

FOREIGN PATENT DOCUMENTS

| | | |
|---|---|---|
| JP | 2019-216379 A | 12/2019 |
| WO | 2011/142082 A1 | 11/2011 |

* cited by examiner

SOLID-STATE IMAGING ELEMENT AND IMAGING APPARATUS

TECHNICAL FIELD

The present technology relates to a solid-state imaging element. More specifically, the present technology relates to a solid-state imaging element that integrates a digital signal and an imaging apparatus.

BACKGROUND ART

There has been used a TDI (Time Delay Integration) sensor in the field of FA (Factory Automation) and aerial shooting. The TDI sensor performs a TDI process that integrates an amount of charge while shifting time in step with a traveling speed of a subject. For example, a solid-state imaging element has been proposed whose adjacent two lines share a floating diffusion layer for one line and which transfers the respective charge of the two lines to the floating diffusion layer at different times (refer, for example, to PTL 1 listed below). The TDI process is realized by this transfer of the charge. A photoelectric conversion element and a plurality of transistors such as a transfer transistor are arranged in each of pixels in the line.

CITATION LIST

Patent Literature

[PTL1]
Japanese Translations of PCT for Patent No. 2014-510447

SUMMARY

Technical Problem

The above conventional technology improves brightness and reduces noise in the TDI process. However, the reduction of an area of the floating diffusion layer and the number of transistors thereof in the above solid-state imaging element to improve pixel sensitivity may lead to degraded performance of the solid-state imaging element even if a light-receiving area of the photoelectric conversion element is expanded.

The present technology has been devised in light of the foregoing, and it is an object of the present technology to improve the pixel sensitivity of the solid-state imaging element that performs the TDI.

Solution to Problem

The present technology has been made to solve the above problem, and a first aspect thereof is a solid-state imaging element that includes a plurality of photoelectric conversion elements and a given number of transistors. The photoelectric conversion elements are arranged along a given direction with a given spacing, and a size of each of the photoelectric conversion elements along the given direction does not exceed the given spacing. The transistors are arranged between the plurality of photoelectric conversion elements and generate a signal commensurate with an amount of charge generated by any of the photoelectric conversion elements. This has an action of expanding the light-receiving area of the photoelectric conversion elements as compared to the case where no spacings are provided.

Also, in the first aspect, any of the plurality of photoelectric conversion elements may be arranged in a pixel circuit that generates a pixel signal. The given number of transistors may be arranged in the pixel circuit and an amplifying circuit that amplifies the pixel signal. This has an action of amplifying the pixel signal.

Also, in the first aspect, the given number of transistors may include a pair of differential transistors that differentially amplify a given reference signal and the pixel signal. The amplifying circuit may include a pair of transistors that are connected in series to a power supply, and a capacitance. A gate of one of the pair of transistors may be connected to a floating diffusion layer. The capacitance may be inserted between a connection point between the pair of transistors and a gate of one of the pair of differential transistors. This has an action of relaxing coupling between a gate-to-source capacitance and the floating diffusion layer.

Also, in the first aspect, the solid-state imaging element may further include a floating diffusion layer and a transfer transistor. The floating diffusion layer is arranged between the plurality of photoelectric conversion elements. The transfer transistor transfers charge from any of the plurality of photoelectric conversion elements to the floating diffusion layer. The given number of transistors may include a discharge transistor that discharges the charge from the floating diffusion layer. Any of the plurality of photoelectric conversion elements, the floating diffusion layer, the transfer transistor, and the discharge transistor may be arranged in the pixel circuit. This has an action of generating the pixel signal.

Also, in the first aspect, the given number of transistors may include a gain control transistor that controls an analog gain with respect to a voltage of the floating diffusion layer. The gain control transistor may be arranged in the pixel circuit. This has an action of controlling the analog gain.

Also, in the first aspect, the given number of transistors may include a reset transistor that initializes the floating diffusion layer. The reset transistor may be arranged in the pixel circuit. This has an action of initializing the floating diffusion layer.

Also, in the first aspect, the solid-state imaging element may further include an analog-digital conversion section that converts a pixel signal commensurate with an amount of light received by each of the plurality of photoelectric conversion elements into a digital signal. This has an action of generating the digital signal.

Also, in the first aspect, the solid-state imaging element may further include a time delay integration circuit that performs a time delay integration process on the digital signal. This has an action of improving brightness and reducing noise by using the time delay integration process.

Also, in the first aspect, the plurality of photoelectric conversion elements and the given number of transistors may be arranged in a given light-receiving chip. The analog-digital conversion section may be arranged in a given circuit chip. This has an action of facilitating pixel miniaturization by using a laminated structure.

Also, a second aspect of the present technology is an imaging apparatus that includes a plurality of photoelectric conversion elements, a given number of transistors, and a signal processing circuit. The photoelectric conversion elements are arranged along a given direction with a given spacing, and a size of each of the photoelectric conversion elements along the given direction does not exceed the given spacing. The transistors are arranged between the plurality of photoelectric conversion elements and generate a signal commensurate with an amount of charge generated by any of the photoelectric conversion elements. The signal processing circuit processes a digital signal commensurate with an amount of light received by each of the plurality of photoelectric conversion elements. This has an action of processing the digital signal of the pixel whose sensitivity has been improved.

DESCRIPTION OF EMBODIMENTS

Description will be given below of modes for carrying out the present technology (hereinafter referred to as embodiments). The description will be given in the following order.

1. First embodiment (example in which a plurality of photoelectric conversion elements is arranged with a spacing)
2. Second embodiment (example in which the plurality of photoelectric conversion elements is arranged with a spacing and in which a reset transistor is removed)
3. Third embodiment (example in which a floating diffusion layer is shared by a plurality of pixels)

1. First Embodiment

Configuration Example of the Imaging Apparatus

Figure 1:
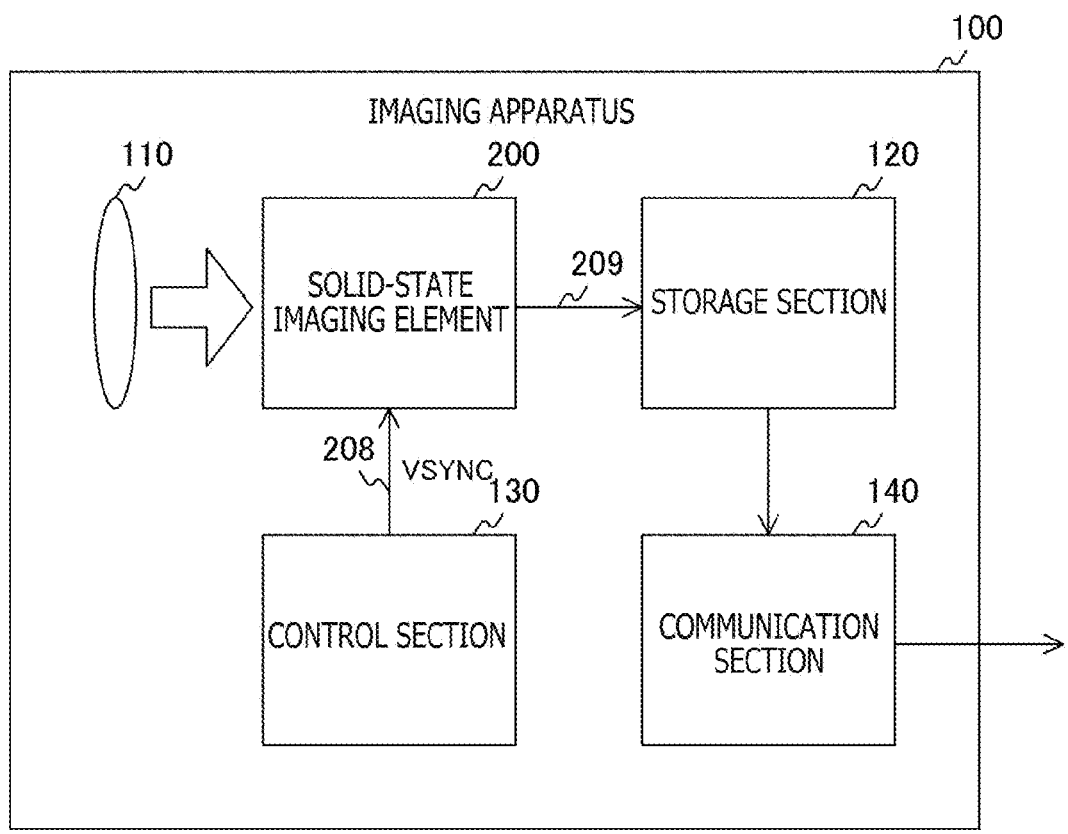
FIG. 1 is a block diagram illustrating an example of a configuration of an imaging apparatus in a first embodiment of the present technology.

FIG. 1 is a block diagram illustrating an example of a configuration of an imaging apparatus 100 in a first embodiment of the present technology. The imaging apparatus 100 is an apparatus that captures image data and includes an optical section 110, a solid-state imaging element 200, a storage section 120, a control section 130, and a communication section 140.

The optical section 110 concentrates incident light and guides the light onto the solid-state imaging element 200. The solid-state imaging element 200 captures image data. The solid-state imaging element 200 supplies image data to the storage section 120 via a signal line 209.

The storage section 120 stores the image data. The control section 130 controls the solid-state imaging element 200 to capture image data. The control section 130 supplies, for example, a vertical synchronizing signal VSYNC indicating an imaging timing to the solid-state imaging element 200 via a signal line 208.

The communication section 140 reads out image data from the storage section 120 and sends the image data to external equipment.

Figure 2:
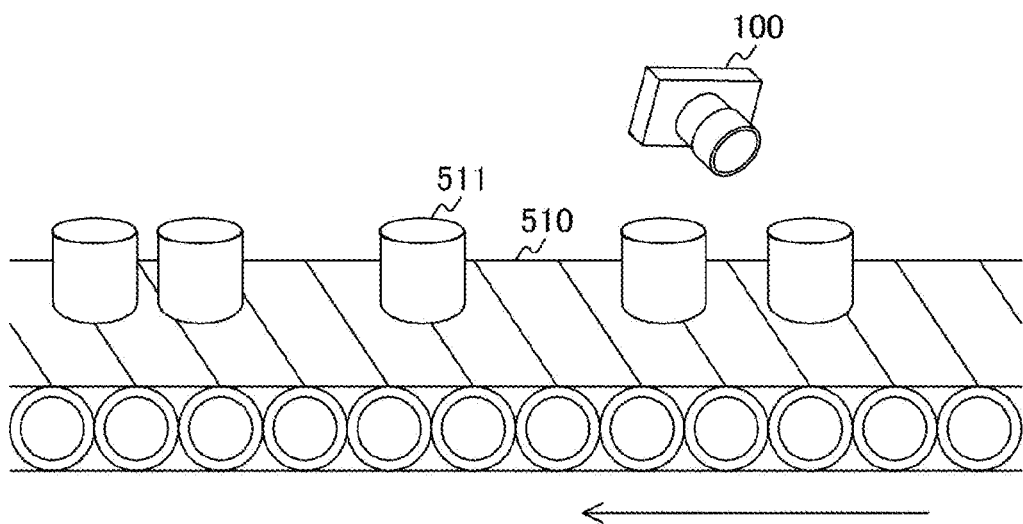
FIG. 2 is a diagram for describing an example of usage of an imaging system in the first embodiment of the present technology.

FIG. 2 is a diagram for describing an example of usage of the imaging apparatus 100 in the first embodiment of the present technology. As illustrated in the figure, the imaging apparatus 100 is used in a factory having a belt conveyor 510 or the like.

The belt conveyor 510 moves subjects 511 in a given direction at a constant speed. The imaging apparatus 100 is fixed near the belt conveyor 510 and generates image data by capturing images of the subjects 511. Image data is used, for example, to inspect for defects or for other purposes. This realizes FA.

It should be noted that, although the imaging apparatus 100 captures images of the subjects 511 that move at the constant speed, the present technology is not limited to this configuration. The imaging apparatus 100 may capture images by moving at a constant speed relative to the subject as in aerial shooting.

Configuration Example of the Solid-State Imaging Element

Figure 3:
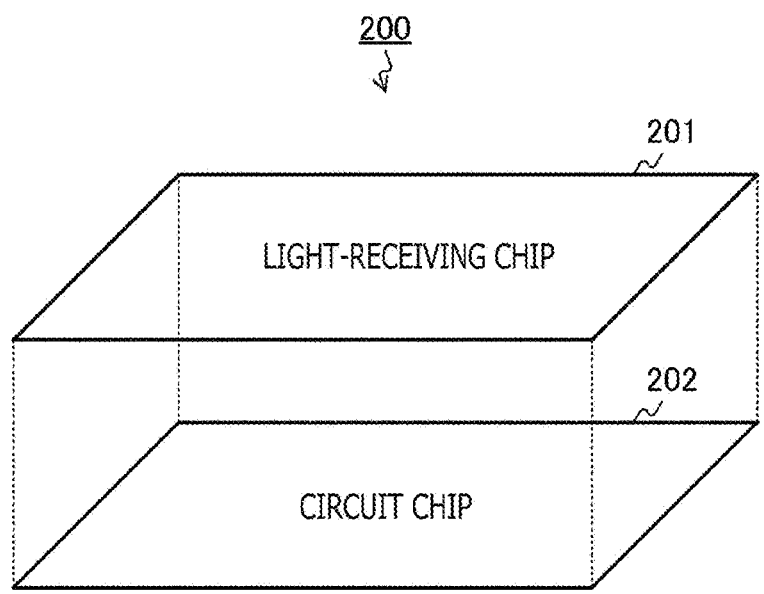
FIG. 3 is a diagram illustrating an example of a laminated structure of a solid-state imaging element in the first embodiment of the present technology.

FIG. 3 is a diagram illustrating an example of a laminated structure of the solid-state imaging element 200 in the first embodiment of the present technology. The solid-state imaging element 200 includes a circuit chip 202 and a light-receiving chip 201 that is stacked on the circuit chip 202. These chips are electrically connected via a connection section such as a via. It should be noted that the chips can be connected by using not only the via but also a Cu-to-Cu joint and a bump.

Figure 4:
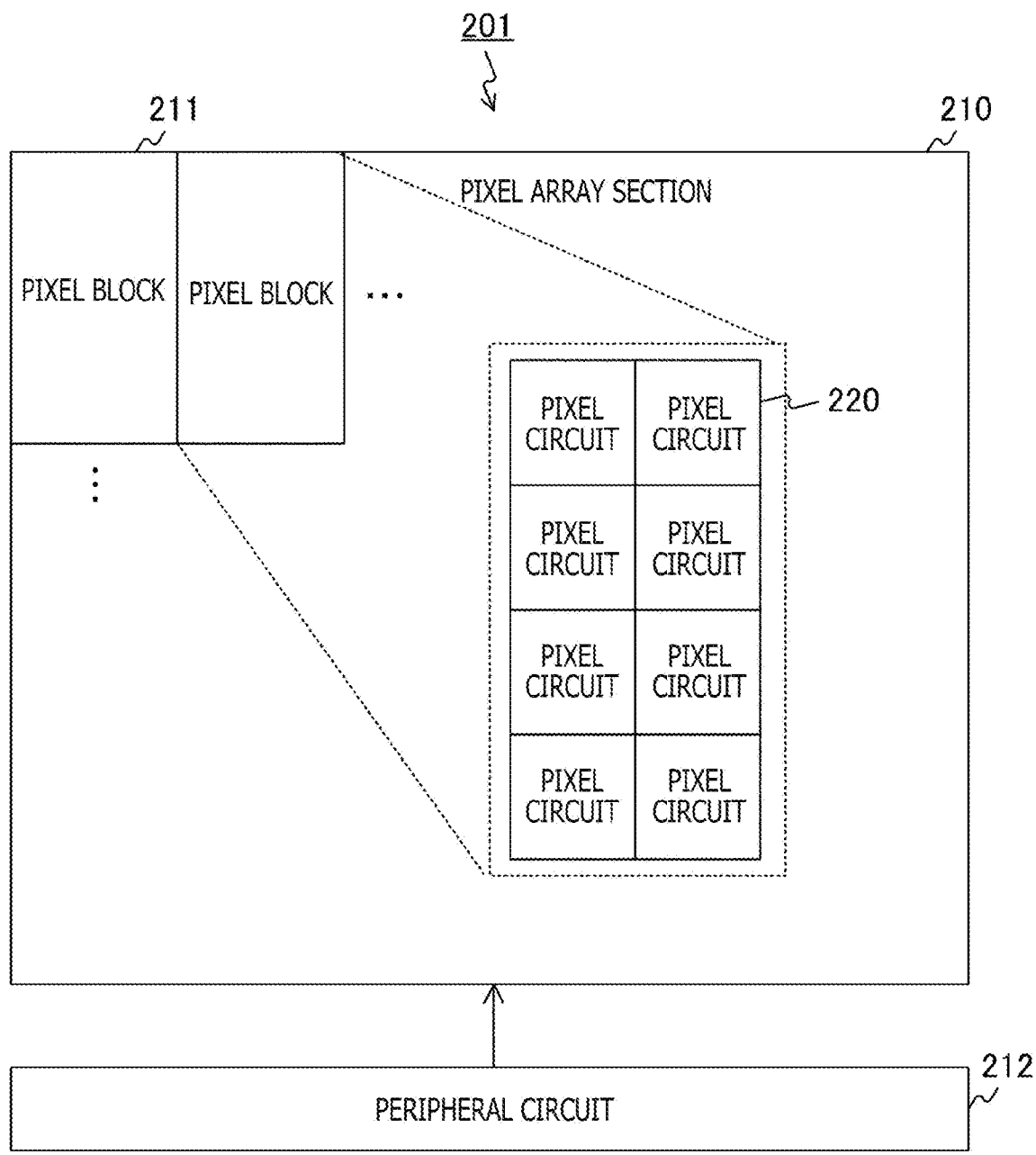
FIG. 4 is a block diagram illustrating an example of a configuration of a light-receiving chip in the first embodiment of the present technology.

FIG. 4 is a block diagram illustrating an example of a configuration of the light-receiving chip 201 in the first embodiment of the present technology. A pixel array section 210 and a peripheral circuit 212 are provided in the light-receiving chip 201.

A plurality of pixel circuits 220 is arranged in the pixel array section 210 in a two-dimensional grid pattern. Also, the pixel array section 210 is divided into a plurality of pixel blocks 211. Four rows by two columns of the pixel circuits 220 are, for example, arranged in each of the pixel blocks 211. Also, a plurality of transistors is further provided outside each of the pixel circuits 220. However, these transistors are omitted in the figure for convenience of description.

For example, a circuit that supplies a DC (Direct Current) voltage and the like are arranged in the peripheral circuit 212.

Figure 5:
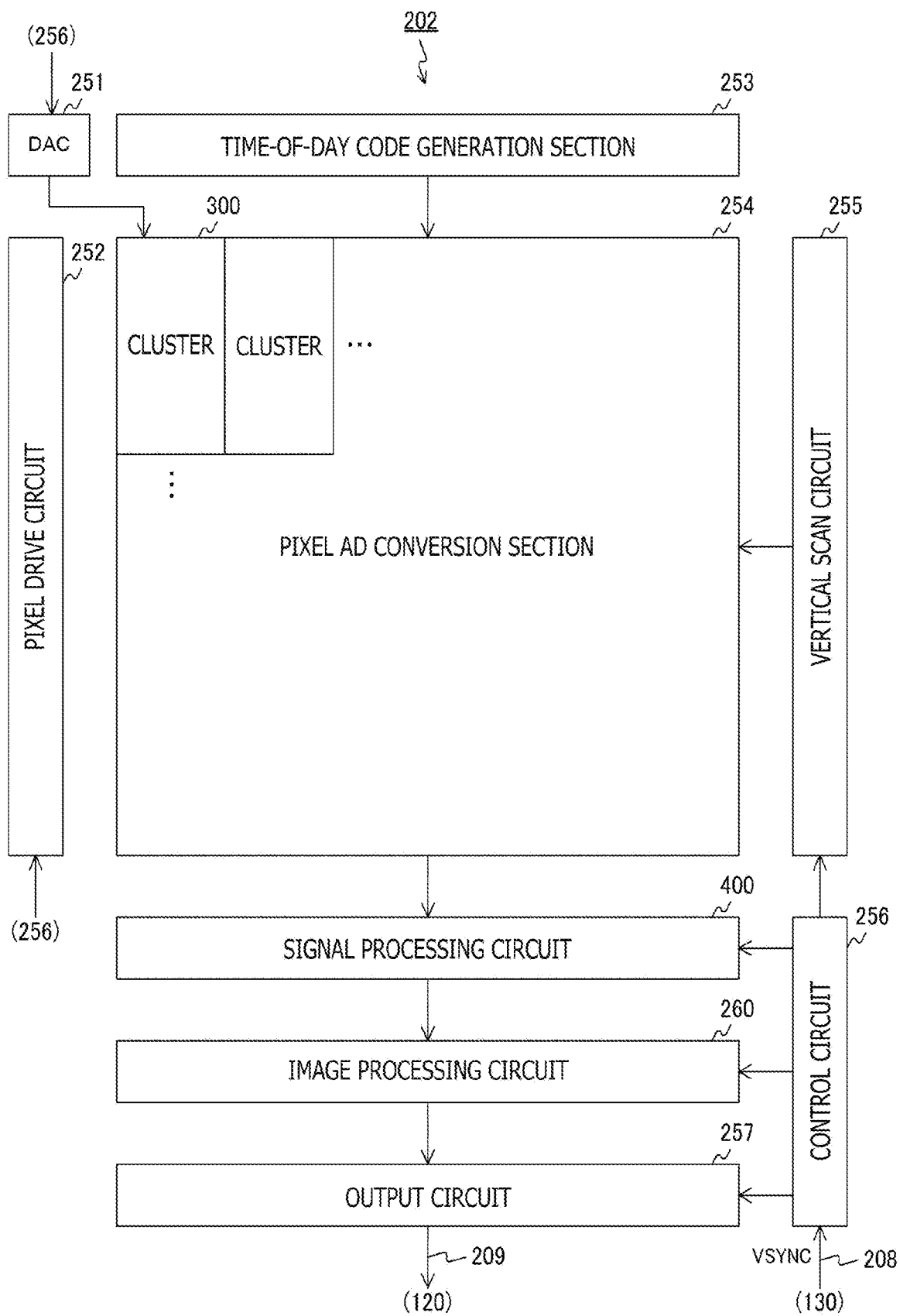
FIG. 5 is a block diagram illustrating an example of a configuration of a circuit chip in the first embodiment of the present technology.

FIG. 5 is a block diagram illustrating an example of a configuration of the circuit chip 202 in the first embodiment of the present technology. A DAC (Digital to Analog Converter) 251, a pixel drive circuit 252, a time-of-day code generation section 253, a pixel AD conversion section 254, and a vertical scan circuit 255 are arranged in the circuit chip 202. Further, a control circuit 256, a signal processing circuit 400, an image processing circuit 260, and an output circuit 257 are arranged in the circuit chip 202.

The DAC 251 generates a reference signal by using DA (Digital to Analog) conversion over a given AD conversion period. For example, a saw tooth ramp signal is used as the reference signal. The DAC 251 supplies the reference signal to the pixel AD conversion section 254.

The time-of-day code generation section 253 generates a time-of-day code indicating a time of day in the AD conversion period. The time-of-day code generation section 253 is realized, for example, by a counter. A gray code counter is, for example, used as the counter. The time-of-day code generation section 253 supplies the time-of-day code to the pixel AD conversion section 254.

The pixel drive circuit 252 drives each of the pixel circuits 220 to generate an analog pixel signal.

The pixel AD conversion section 254 performs AD conversion that converts the analog signal (i.e., pixel signal) of each of the pixel circuits 220 into a digital signal. The pixel AD conversion section 254 is divided by a plurality of clusters 300. The cluster 300 is provided for each pixel block 211 and converts an analog signal in the corresponding pixel block 211 into a digital signal.

The pixel AD conversion section 254 generates, as a frame, image data in which the digital signals have been arranged by the AD conversion, and supplies the image data to the signal processing circuit 400.

The vertical scan circuit 255 drives the pixel AD conversion section 254 to perform the AD conversion.

The signal processing circuit 400 performs given signal processing on the frame. Various processes including a CDS (Correlated Double Sampling) process and the TDI process are performed as signal processing. The signal processing circuit 400 supplies the processed frame to the image processing circuit 260.

The image processing circuit 260 performs given image processing on the frame from the signal processing circuit 400. An image recognition process, a black label correction process, an image correction process, a demosaicing process, and the like are performed as image processing. The image processing circuit 260 supplies the processed frame to the output circuit 257.

The output circuit 257 outputs the frame that has been subjected to the image processing to external equipment.

The control circuit 256 controls an operation timing of each of the DAC 251, the pixel drive circuit 252, the vertical scan circuit 255, the signal processing circuit 400, the image processing circuit 260, and the output circuit 257 synchronously with the vertical synchronizing signal VSYNC.

Configuration Example of the Pixel AD Conversion Section

Figure 6:
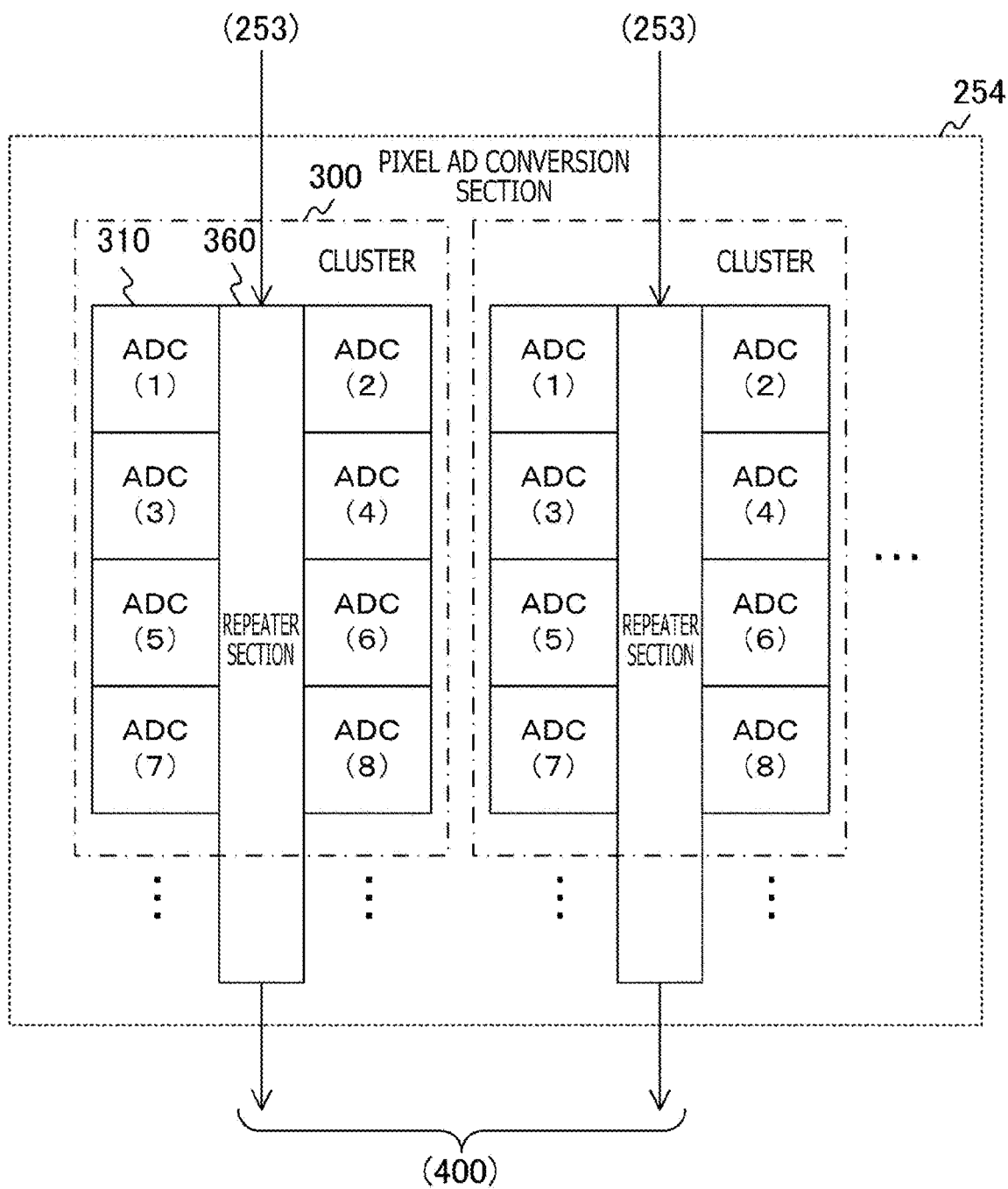
FIG. 6 is a diagram illustrating an example of a configuration of a pixel AD (Analog to Digital) conversion section in the first embodiment of the present technology.

FIG. 6 is a diagram illustrating an example of a configuration of the pixel AD conversion section 254 in the first embodiment of the present technology. A plurality of ADCs 310 is arranged in the pixel AD conversion section 254 in a two-dimensional grid pattern. The ADC 310 is arranged for each pixel circuit 220. In the case where N rows (where N is an integer) by M columns (where M is an integer) of the pixel circuits 220 are provided, the N-by-M ADCs 310 are arranged.

As many ADCs 310 as the number of pixel circuits 220 in the pixel block 211 are arranged in each cluster 300. In the case where four rows by two columns of the pixel circuits 220 are arranged in the pixel block 211, four rows by two columns of the ADCs 310 are arranged in the cluster 300.

The ADC 310 performs the AD conversion on an analog pixel signal generated by the corresponding pixel circuit 220. The ADC 310 compares, in the AD conversion, the pixel signal with the reference signal and retains a time-of-day code obtained when a comparison result thereof is inverted. Then, the ADC 310 outputs the retained time-of-day code as a digital signal converted from the analog signal.

Also, a repeater section 360 is arranged for each column of the clusters 300. In the case where the number of columns of the clusters 300 is M/2, the M/2 repeater sections 360 are arranged. The repeater section 360 transfers a time-of-day code. The repeater section 360 transfers the time-of-day code from the time-of-day code generation section 253 to the ADC 310. Also, the repeater section 360 transfers a digital signal from the ADC 310 to the signal processing circuit 400. This transfer of the digital signal is referred to as "readout" of the digital signal.

Also, in the figure, the numbers in brackets indicate an example of an order for reading out the digital signals of the ADCs 310. For example, the digital signal in the first row and odd-numbered column is read out first, and the digital signal in the first row and even-numbered column is read out second. The digital signal in the second row and odd-numbered column is read out third, and the digital signal in the second row and even-numbered column is read out third. From here onward, the digital signals in the respective rows and odd- and even-numbered columns are similarly read out in rotation.

It should be noted that, although the ADC 310 is arranged for each pixel circuit 220, the present technology is not limited to this configuration. One ADC 310 may be shared by a plurality of pixel circuits 220.

Configuration Example of the ADC

Figure 7:
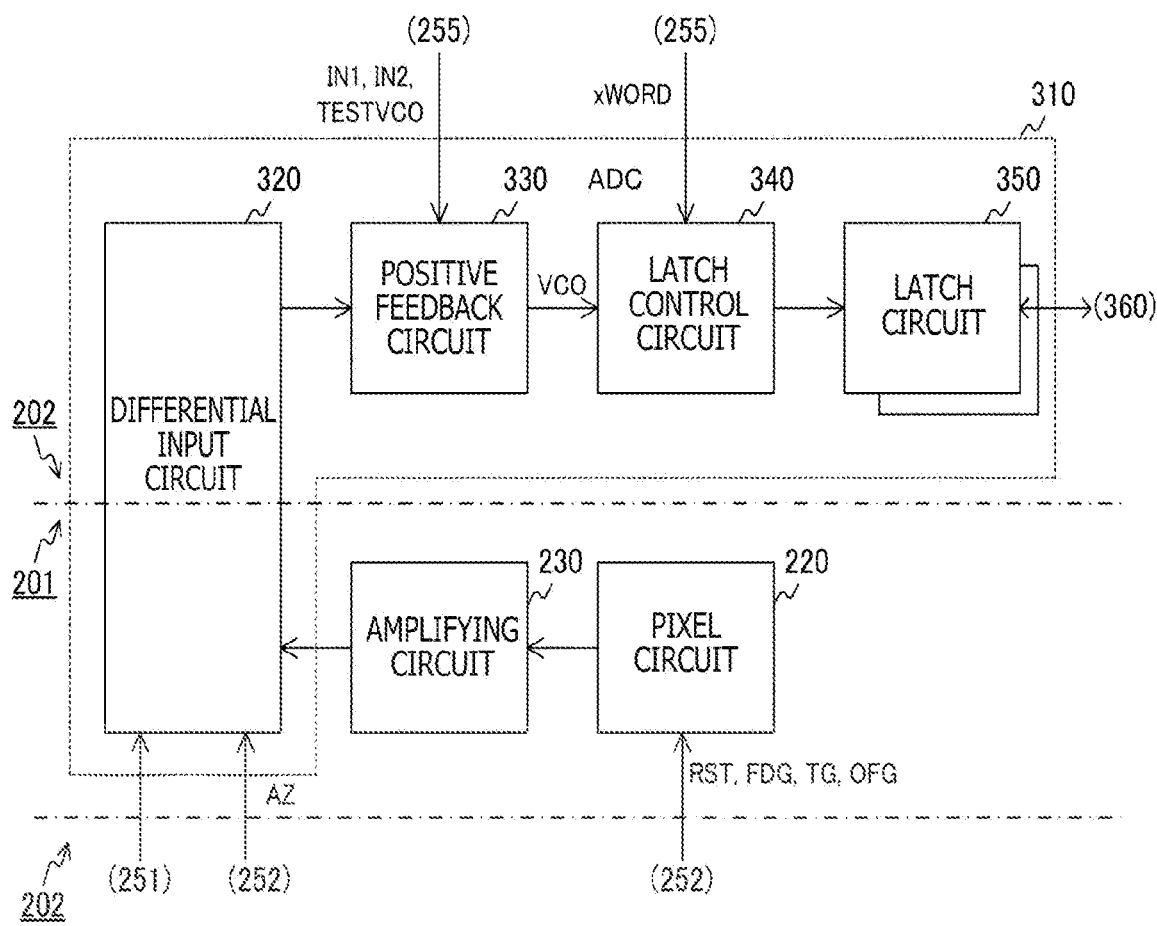
FIG. 7 is a block diagram illustrating an example of a configuration of an ADC (Analog to Digital Converter) in the first embodiment of the present technology.

FIG. 7 is a block diagram illustrating an example of a configuration of the ADC 310 in the first embodiment of the present technology. The ADC 310 includes a differential input circuit 320, a positive feedback circuit 330, a latch control circuit 340, and a plurality of latch circuits 350.

Also, an amplifying circuit 230 is arranged between the pixel circuit 220 and the ADC 310. The amplifying circuit 230 amplifies a pixel signal from the pixel circuit 220 and supplies the amplified pixel signal to the ADC 310. The circuit that includes the pixel circuit 220 and the amplifying circuit 230 functions as one pixel.

Also, the pixel circuit 220, the amplifying circuit 230, and part of the differential input circuit 320 are arranged in the light-receiving chip 201, and the remainder of the differential input circuit 320 and the circuits at succeeding stages thereof are arranged in the circuit chip 202.

The differential input circuit 320 compares the pixel signal from the amplifying circuit 230 with the reference signal from the DAC 251. The differential input circuit 320 supplies a comparison result signal indicating the comparison result to the positive feedback circuit 330.

The positive feedback circuit 330 adds part of the output to the input (comparison result signal) and supplies the resultant signal to the latch control circuit 340 as an output signal VCO.

The latch control circuit 340 causes the plurality of latch circuits 350 to retain the time-of-day code obtained when the output signal VCO is inverted, according to a control signal xWORD from the vertical scan circuit 255.

The latch circuits 350 retain the time-of-day code from the repeater section 360 under control of the latch control circuit 340. As many latch circuits 350 as the number of bits of the time-of-day code are provided. For example, in the case where the time-of-day code is 15 bits long, 15 latch circuits 350 are arranged in the ADC 310. Also, the retained time-of-day code is read out by the repeater section 360 as a digital signal converted from an analog signal.

With the configuration illustrated in the figure, the ADC 310 converts the pixel signal from the amplifying circuit 230 into a digital signal.

Figure 8:
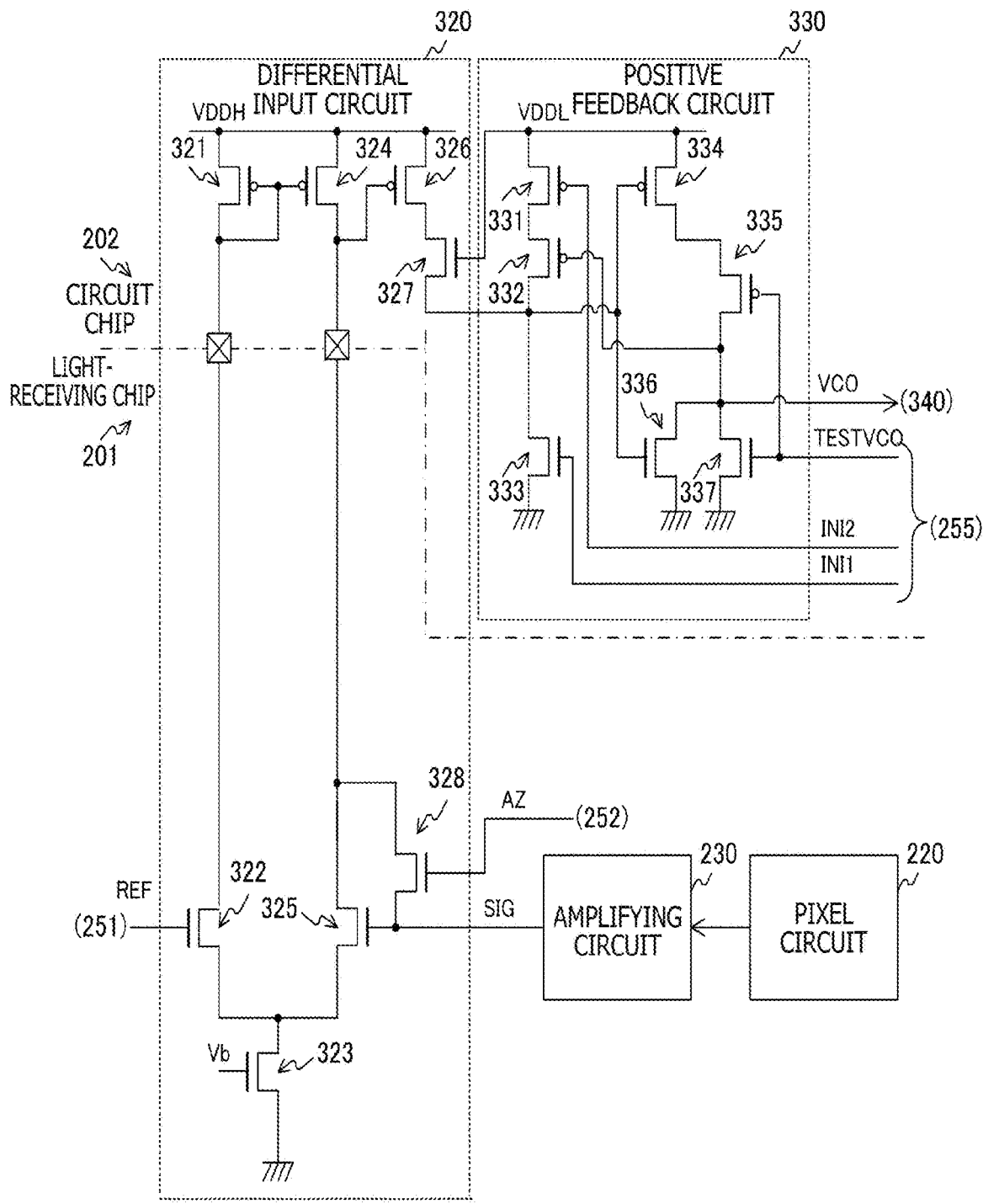
FIG. 8 is a circuit diagram illustrating examples of configurations of a differential input circuit and a positive feedback circuit in the first embodiment of the present technology.

Configuration Examples of the Differential Input Circuit and the Positive Feedback Circuit FIG. 8 is a circuit diagram illustrating examples of configurations of the pixel circuit 220, the differential input circuit 320, and the positive feedback circuit 330 in the first embodiment of the present technology.

The differential input circuit 320 includes pMOS (p-channel Metal Oxide Semiconductor) transistors 321, 324, and 326. Also, the differential input circuit 320 includes nMOS (n-channel MOS) transistors 322, 323, 325, 327, and 328. Of these, the nMOS transistors 322, 323, 325, and 328 are arranged in the light-receiving chip 201, and the remaining transistors are arranged in the circuit chip 202.

The nMOS transistors 322 and 325 constitute a differential pair, and sources of these transistors are connected together to a drain of the nMOS transistor 323. Also, a drain of the nMOS transistor 322 is connected to a drain of the pMOS transistor 321 and gates of the pMOS transistors 321 and 324. A drain of the nMOS transistor 325 is connected to a drain of the pMOS transistor 324 and a gate of the pMOS transistor 326. Also, a reference signal REF from the DAC 251 is input to a gate of the nMOS transistor 322.

A given bias voltage Vb is applied to a gate of the nMOS transistor 323, and a given ground voltage is applied to a source of the nMOS transistor 323.

A pixel signal SIG from the amplifying circuit 230 is input to a gate of the nMOS transistor 325.

The pMOS transistors 321, 324, and 326 constitute a current mirror circuit. A supply voltage VDDH is applied to sources of the pMOS transistors 321, 324, and 326. The supply voltage VDDH is higher than a supply voltage VDDL which will be described later.

The supply voltage VDDL is applied to a gate of the nMOS transistor 327. Also, a drain of the nMOS transistor 327 is connected to a drain of the pMOS transistor 326, and a source of the nMOS transistor 327 is connected to the positive feedback circuit 330.

The nMOS transistor 328 short-circuits the gate and the drain of the nMOS transistor 325 according to an auto-zero signal AZ from the pixel drive circuit 252.

The positive feedback circuit 330 includes pMOS transistors 331, 332, 334, and 335 and nMOS transistors 333, 336, and 337. The pMOS transistors 331 and 332 and the nMOS transistor 333 are connected in series to the supply voltage VDDL. Also, a drive signal INI2 from the vertical scan circuit 255 is input to a gate of the pMOS transistor 331. A connection point between the pMOS transistor 332 and the nMOS transistor 333 is connected to the source of the nMOS transistor 327.

The ground voltage is applied to a source of the nMOS transistor 333, and a drive signal INI1 from the vertical scan circuit 255 is input to a gate of the nMOS transistor 333.

The pMOS transistors 334 and 335 are connected in series to the supply voltage VDDL. Also, a drain of the pMOS transistor 335 is connected to a gate of the pMOS transistor 332 and drains of the nMOS transistors 336 and 337. A control signal TESTVCO from the vertical scan circuit 255 is input to gates of the pMOS transistor 335 and the nMOS transistor 337. Also, gates of the pMOS transistor 334 and the nMOS transistor 336 are connected to the connection point between the pMOS transistor 332 and the nMOS transistor 333.

An output signal VCO is output from a connection point between the pMOS transistor 335 and the nMOS transistor 337. Also, the ground voltage is applied to sources of the nMOS transistors 336 and 337.

It should be noted that each of the differential input circuit 320 and the positive feedback circuit 330 is not limited to the circuit illustrated in FIG. 8 as long as functions described with reference to FIG. 7 are provided.

Configuration Examples of the Amplifying Circuit and the Pixel Circuit

Figure 9:
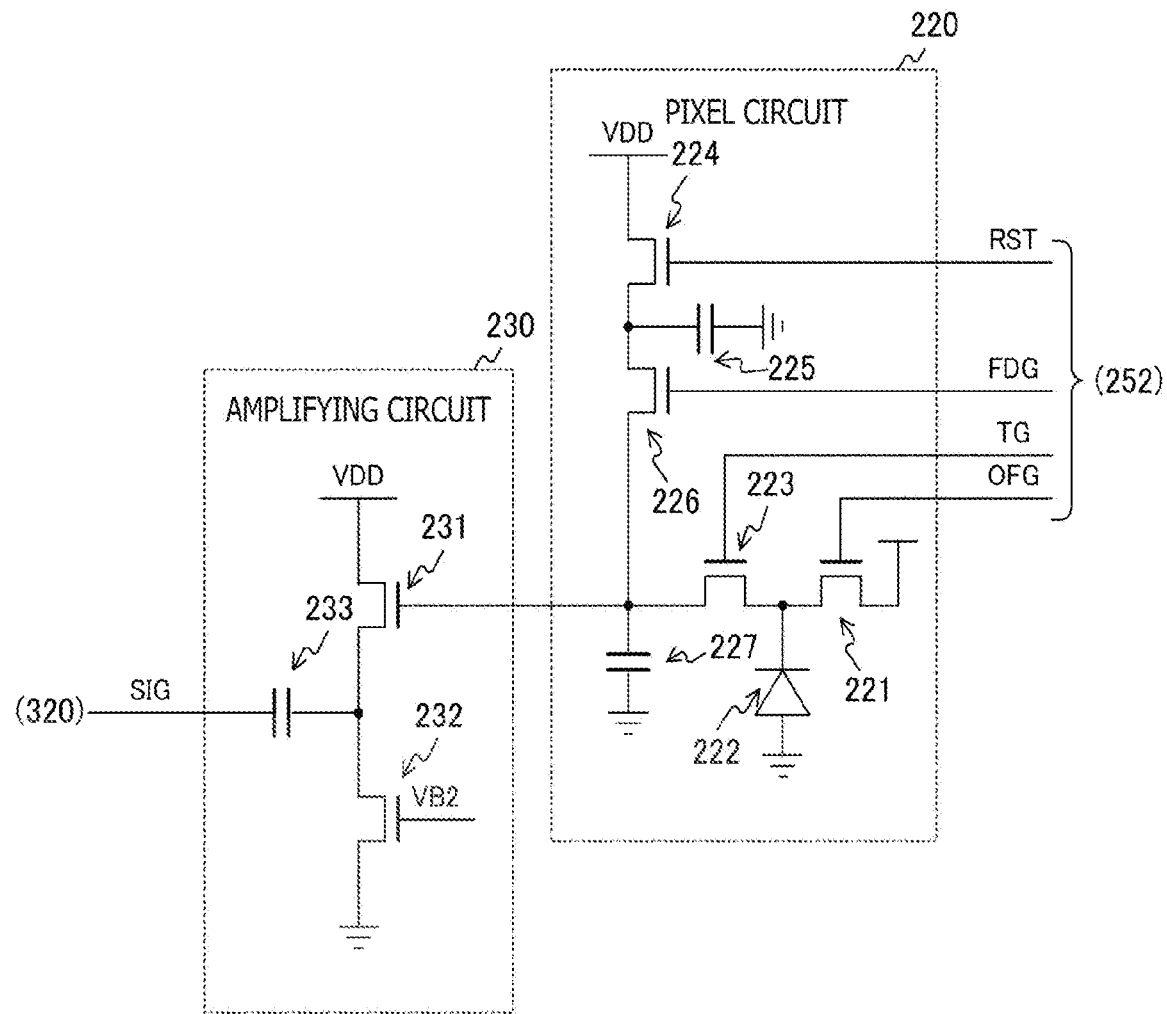
FIG. 9 is a circuit diagram illustrating examples of configurations of a pixel circuit and an amplifying circuit in the first embodiment of the present technology.

FIG. 9 is a circuit diagram illustrating examples of configurations of the pixel circuit 220 and the amplifying circuit 230 in the first embodiment of the present technology.

The pixel circuit 220 includes a discharge transistor 221, a photoelectric conversion element 222, a transfer transistor 223, a reset transistor 224, a capacitance 225, a gain control transistor 226, and a floating diffusion layer 227. nMOS transistors are, for example, used as the discharge transistor 221, the transfer transistor 223, the reset transistor 224, and the gain control transistor 226.

The discharge transistor 221 discharges the charge accumulated in the photoelectric conversion element 222 according to a drive signal OFG from the pixel drive circuit 252. The photoelectric conversion element 222 generates the charge through photoelectric conversion.

The transfer transistor 223 transfers the charge from the photoelectric conversion element 222 to the floating diffusion layer 227 according to a transfer signal TG from the pixel drive circuit 252.

The reset transistor 224 initializes the floating diffusion layer 227 according to a reset signal RST from the pixel drive circuit 252.

The capacitance 225 is inserted between a connection node between the reset transistor 224 and the gain control transistor 226 and a ground terminal.

The gain control transistor 226 controls an analog gain with respect to the voltage of the floating diffusion layer 227 according to a control signal FDG from the pixel drive circuit 252. It is possible to increase the amount of signal handled, that is, the amount of saturation signal, of the pixel circuit 220 by reducing the voltage of the floating diffusion layer 227 with the analog gain and outputting the reduced voltage.

The floating diffusion layer 227 accumulates the transferred charge and generates the voltage commensurate with the amount of charge.

Also, the amplifying circuit 230 includes nMOS transistors 231 and 232 and a capacitance 233. The nMOS transistors 231 and 232 are connected in series between a power supply and the ground terminal. A gate of the nMOS transistor 231 on a power supply side is connected to the floating diffusion layer 227. A given bias voltage VB2 is applied to a gate of the nMOS transistor 232 on a ground side.

Also, a connection node between the nMOS transistors 231 and 232 is connected to the differential input circuit 320 via the capacitance 233. Letting a gate-to-source capacitance of the nMOS transistor 325 on a pixel signal side of the differential pair in the differential input circuit 320 be denoted as Cgs, a capacitance value of the capacitance 233 is set considerably larger than the gate-to-source capacitance Cgs. Assuming that the floating diffusion layer 227 and the gate of the nMOS transistor 325 are directly connected, the floating diffusion layer 227 may fluctuate significantly due to coupling between the gate-to-source capacitance Cgs and the floating diffusion layer 227, which lengthens the AD conversion period. However, it is possible to alleviate this effect caused by the coupling by adding the capacitance 233.

It should be noted that each of the pixel circuit 220 and the amplifying circuit 230 is not limited to the circuit illustrated in FIG. 9 as long as the functions described with reference to FIG. 7 are provided.

Figure 10:
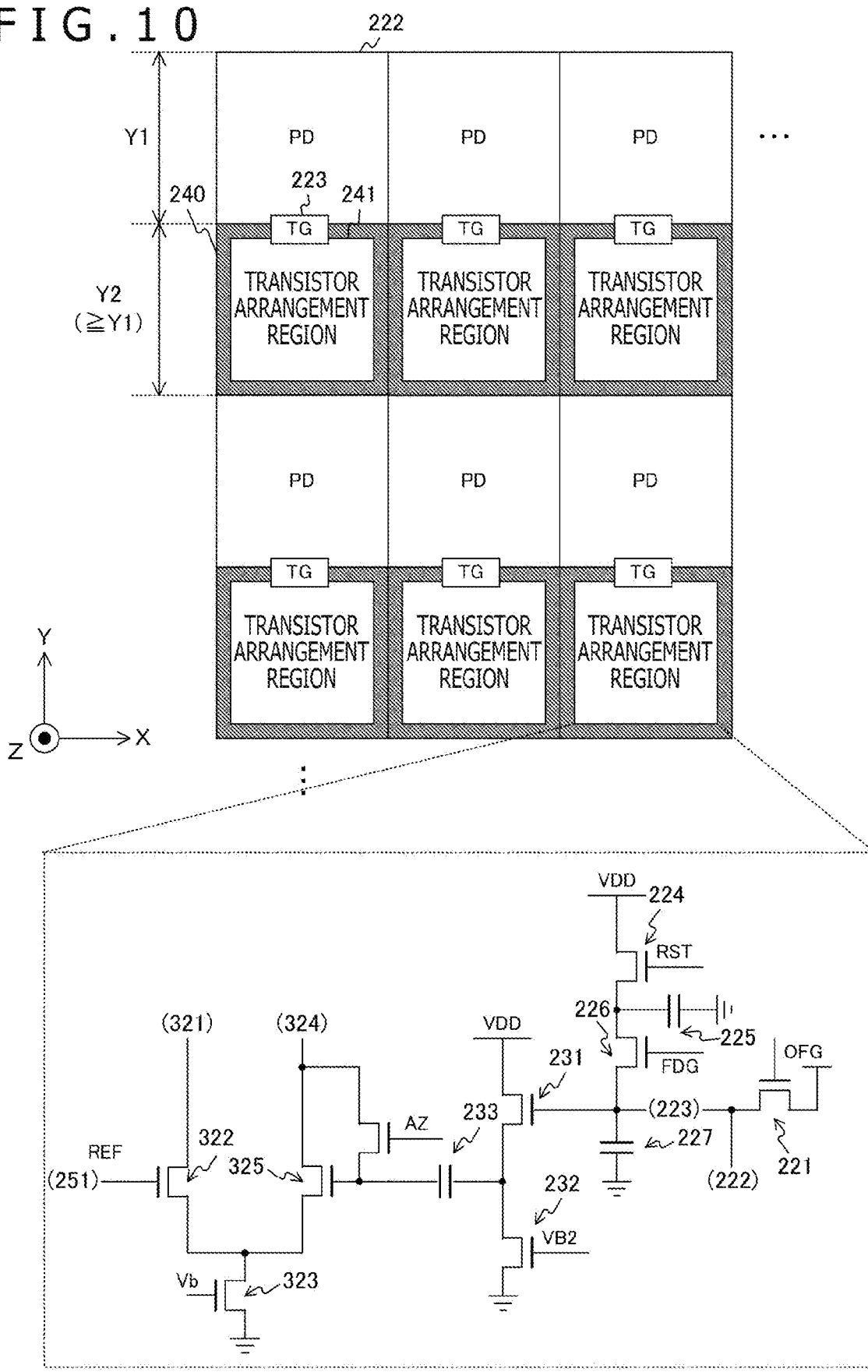
FIG. 10 is a plan view illustrating an example of layout of elements in a pixel in the first embodiment of the present technology.

FIG. 10 is a plan view illustrating an example of layout of elements in a pixel in the first embodiment of the present technology. It is assumed that an optical axis of incident light is a Z axis, that a given axis vertical to the Z axis is an X axis, and that an axis vertical to the Z and X axes is a Y axis.

In a light-receiving surface, that is, in an XY plane, the plurality of photoelectric conversion elements 222 is arranged in N rows by M columns in a two-dimensional grid pattern. The size of each of the photoelectric conversion elements 222 in the Y-axis direction is denoted as Y1. In the XY plane, M photoelectric conversion elements 222 are arranged adjacent to each other with no spacing in the X-axis direction. A set of the M photoelectric conversion elements 222 arranged along the X-axis direction and a set of digital signals corresponding thereto will be hereinafter referred to as a "line." Meanwhile, N photoelectric conversion elements 222 are arranged with a spacing of Y2 along the Y-axis direction. In other words, the N lines are arranged with the spacing of Y2. Here, it is assumed that the following relation holds between the size Y1 and the spacing Y2:

$$Y1 \leq Y2 \ldots \quad \text{Formula 1}$$

In the figure, the spacing Y2 is equal to the size Y1. It should be noted that the spacing Y2 can be increased larger than the size Y1 as illustrated in Formula 1. In the case where the spacing Y2 is increased larger than the size Y1, the spacing Y2 is set to be an integer multiple of Y1. The larger the spacing Y2, the larger the size of the lower ADC 310 in the Y-axis direction can be increased. Accordingly, it is possible to miniaturize the pixels in the X-axis direction by additionally reducing the size of the ADC 310 in the X-axis direction.

Also, a transistor arrangement region 241 is provided in a spacing region 240 between each two of the N photoelectric conversion elements 222 in the Y-axis direction. A given number of transistors, the floating diffusion layer 227, and the capacitances 233 and 225 are arranged in the transistor arrangement region 241. The given number of transistors include the discharge transistor 221, the reset transistor 224, the gain control transistor 226, and the nMOS transistors 231, 232, 322, 323, and 325. In other words, the transistors in the differential input circuit 320 illustrated in FIG. 8 and the transistors in the pixel circuit 220 and the amplifying circuit 230 illustrated in FIG. 9 are arranged in the transistor arrangement region 241. These transistors generate a signal (pixel signal or signal obtained by amplifying the pixel signal) commensurate with the amount of charge generated by any one of the plurality of photoelectric conversion elements 222 as described with reference to FIG. 9. Also, the transfer transistor 223 is arranged between the transistor arrangement region 241 and the photoelectric conversion element 222.

Here, a comparative example is assumed where N rows by M columns of the photoelectric conversion elements 222 are arranged along the X- and Y-axis directions with no spacing and where various transistors such as the discharge transistor 221 and the floating diffusion layer 227 are arranged around the photoelectric conversion elements 222. In this comparative example, the larger the number of transistors, the smaller the light-receiving area of the photoelectric conversion element 222.

In contrast, if the N photoelectric conversion elements 222 are arranged with the given spacing in the Y-axis direction as illustrated in the figure, the light-receiving area can be expanded as compared to the comparative example because the transistors and the like can be arranged in the spacing region 240. The expansion of the light-receiving area can improve pixel sensitivity. Also, more transistors can be arranged than in the comparative example, which makes it possible to arrange additional circuits such as the amplifying circuit 230 in addition to the pixel circuit 220.

Configuration Example of the Signal Processing Circuit

Figure 11:
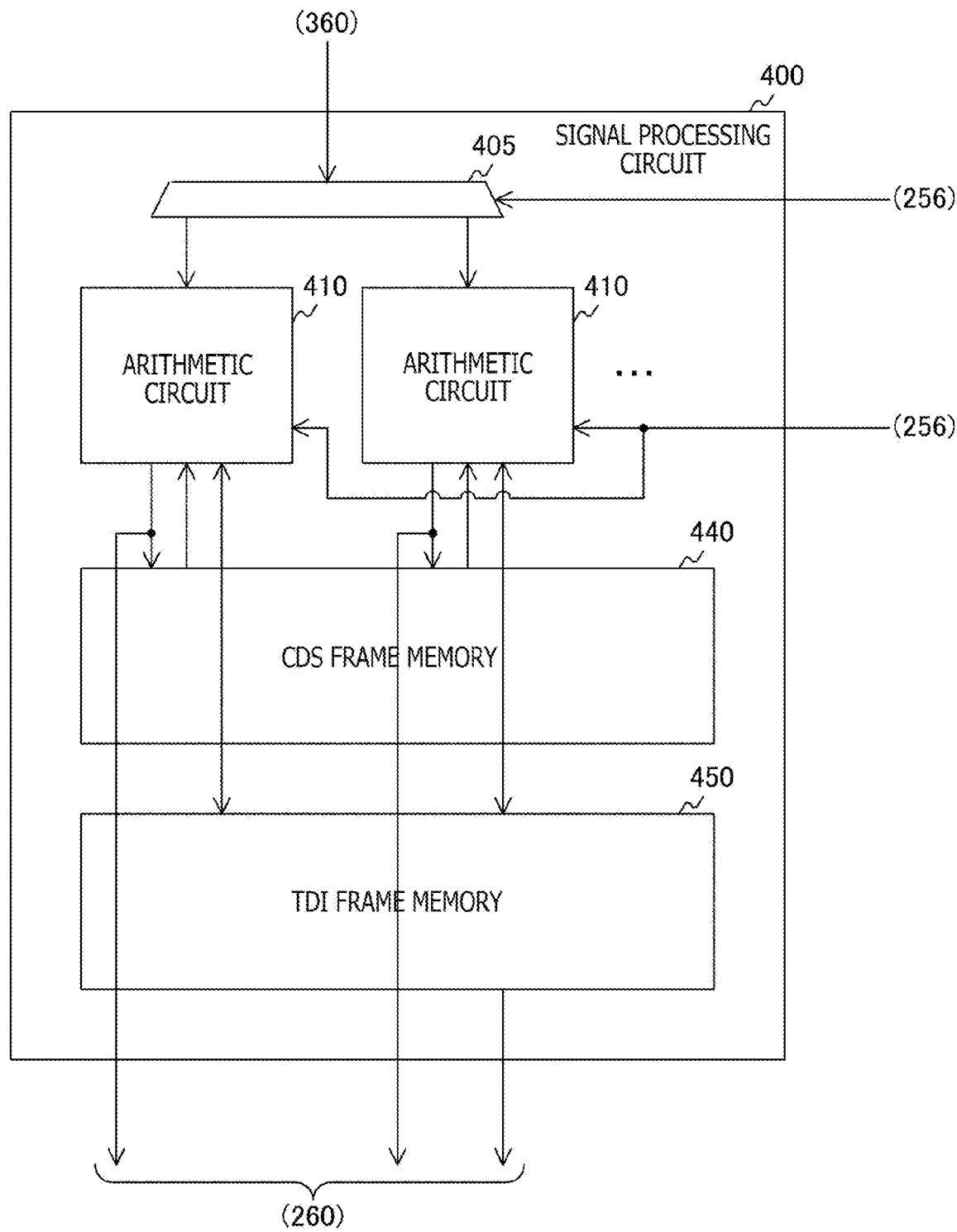
FIG. 11 is a block diagram illustrating an example of a configuration of a signal processing circuit in the first embodiment of the present technology.

FIG. 11 is a block diagram illustrating an example of a configuration of the signal processing circuit 400 in the first embodiment of the present technology. The signal processing circuit 400 includes a plurality of selectors 405, a plurality of arithmetic circuits 410, a CDS frame memory 440, and a TDI frame memory 450.

The selector 405 is arranged for each column of the clusters 300, in other words, for each repeater section 360. In the case where two columns of the ADCs 310 are arranged in a cluster 300, the selector 405 is arranged for each two columns. Also, the arithmetic circuit 410 is arranged for each column of the ADCs 310. In the case where M columns of the ADCs 310 are provided, M/2 selectors 405 and M arithmetic circuits 410 are arranged.

As described earlier, the repeater section 360 outputs the digital signals of the odd- and even-numbered columns in rotation.

The selector 405 selects a destination of the digital signal under control of the control circuit 256. In the case where an odd-numbered column is output by the repeater section 360, the selector 405 outputs the digital signal to the arithmetic circuit 410 corresponding to that odd-numbered column. Meanwhile, in the case where an even-numbered column is output, the selector 405 outputs the digital signal to the arithmetic circuit 410 corresponding to that even-numbered column.

The arithmetic circuit 410 performs the CDS process and the TDI process on the digital signal from the selector 405.

Here, the digital signal includes a P phase level and a D phase level. The P phase level indicates the level when the pixel circuit 220 is initialized by the reset signal RST. Meanwhile, the D phase level indicates the level commensurate with the amount of exposure when the charge is transferred by the transfer signal TG. The P phase level is also referred to as a reset level, and the D phase level is also referred to as a signal level.

In the CDS process, the M arithmetic circuits 410 cause the CDS frame memory 440 to retain a P phase frame in which the P phase level is arranged. Then, the M arithmetic circuits 410 find a difference between the P phase level and the D phase level for each pixel and generate a CDS frame in which differential data is arranged. Meanwhile, in the TDI process, the M arithmetic circuits 410 cause the TDI frame memory 450 to retain a frame that has been subjected to the CDS process and update the TDI frame memory 450 with cumulative sum data.

Also, the M arithmetic circuits 410 supply the CDS frame and the TDI frame that has been subjected to the TDI process to the image processing circuit 260.

Configuration Example of the Arithmetic Circuit

Figure 12:
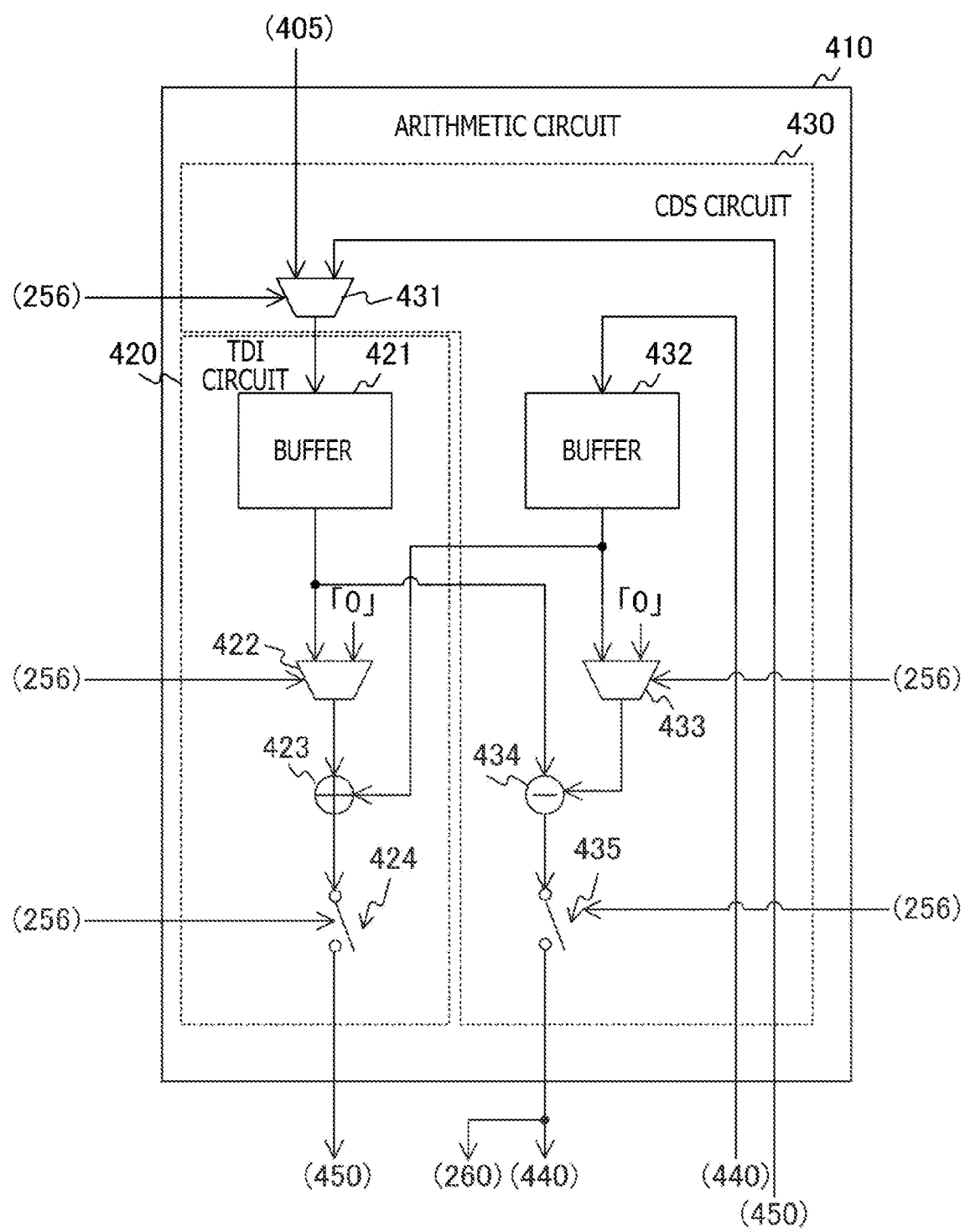
FIG. 12 is a circuit diagram illustrating an example of a configuration of an arithmetic circuit in the first embodiment of the present technology.

FIG. 12 is a circuit diagram illustrating an example of a configuration of the arithmetic circuit 410 in the first embodiment of the present technology. The arithmetic circuit 410 includes a TDI circuit 420 and a CDS circuit 430. The TDI circuit 420 includes a buffer 421, a selector 422, an adder 423, and a switch 424. The CDS circuit 430 includes a selector 431, a buffer 432, a selector 433, a subtractor 434, and a switch 435. The operation between each of the selectors 422, 431, and 433 and each of the switches 424 and 425 is controlled, for example, by the control circuit 256.

The selector 431 selects either the digital signal from the selector 405 or the digital signal from the TDI frame memory 450 and outputs the selected signal to the buffer 421.

The buffer 421 delays the signal from the selector 431 and outputs the delayed signal. It should be noted that the buffer 421 is an example of the second buffer defined in the claims.

The selector 422 selects either the digital signal from the buffer 421 or the digital signal whose decimal value is "0" and outputs the selected signal to the adder 423.

The adder 423 adds the digital signal from the selector 422 and the digital signal from the buffer 432 together. The adder 423 supplies the digital signal indicating the sum to the switch 424 as cumulative sum data.

The switch 424 opens or closes a path between the adder 423 and the TDI frame memory 450.

The buffer 432 delays the signal from the CDS frame memory 440 and outputs the delayed signal. It should be noted that the buffer 432 is an example of the first buffer defined in the claims.

The selector 433 selects either the digital signal from the buffer 432 or the digital signal whose decimal value is "0" and outputs the selected signal to the subtractor 434.

The subtractor 434 calculates the difference between the digital signal from the buffer 421 and the digital signal from the selector 433. The subtractor 434 supplies the digital signal indicating the difference to the switch 435 as differential data.

The switch 435 opens or closes a path between the subtractor 434 and the CDS frame memory 440.

With the configuration illustrated in the figure, the CDS circuit 430 can perform the CDS process. Also, the TDI circuit 420 can perform the TDI process.

Figure 13:
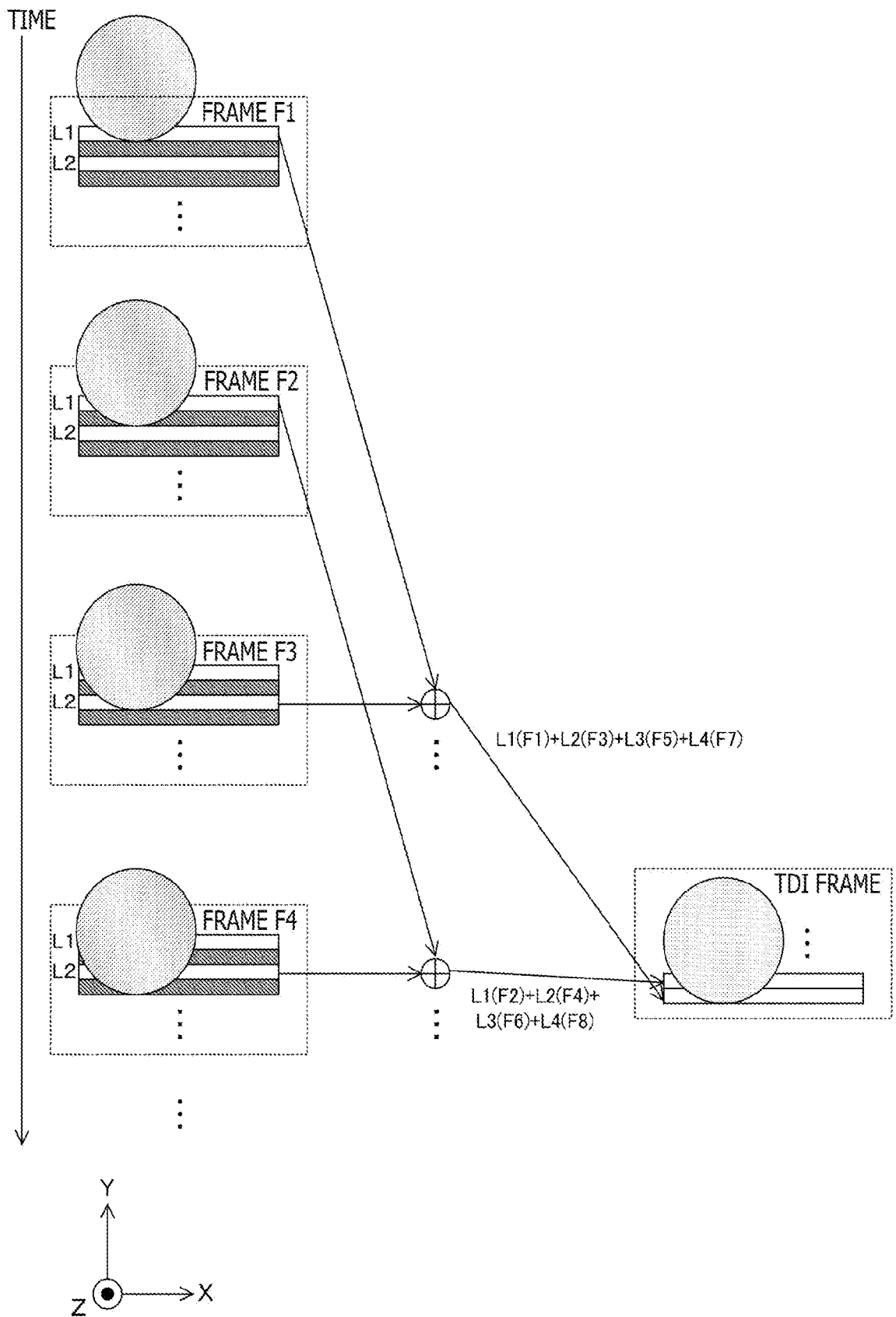
FIG. 13 is a diagram illustrating an example of a TDI process in the first embodiment of the present technology.

FIG. 13 is a diagram illustrating an example of the TDI process in the first embodiment of the present technology. For example, it is assumed that the CDS frame memory 440 and the TDI frame memory 450 are initialized and that a frame F1 is captured first followed by frames F2, F3, F4, F5, F6, F7, and F8 in rotation. In the figure, the frame F5 and the subsequent frames are omitted. Also, arrows in the figure indicate directions of movement of the subject. As illustrated in the figure, it is assumed that this subject moves along the Y-axis direction and one line at a time in a direction of increasing row address. Gray portions between lines in the figure indicate the line-to-line spacing region. It is assumed that the spacing regions are one line in size.

The signal processing circuit 400 adds up, in the TDI process, a line L1 of the frame F1, a line L2 of the frame F3, a line L3 of the frame F5, and a line L4 of the frame F7 that have been subjected to the CDS process. As described earlier, the subject moves one line at a time, and the spacing regions are one line in size. Accordingly, the patterns of the respective lines to be added up are the same. The signal processing circuit 400 outputs the lines that have been added up as the last line of the TDI frame.

Also, the signal processing circuit 400 adds up, in the TDI process, a line L1 of the frame F2, a line L2 of the frame F4, a line L3 of the frame F6, and a line L4 of the frame F8 that have been subjected to the CDS process. The signal processing circuit 400 outputs the lines that have been added up as the second to last line of the TDI frame. Other lines are generated similarly by adding up four lines from the frame F3 and the subsequent frames.

In the case where the subject moves quickly, it is necessary to reduce the exposure time to prevent camera shake. The reduction of the exposure time may result in a darker image. However, the TDI process can improve the brightness by adding up the plurality of lines having the same pattern. Also, the larger the number of lines to be added up, the more reduced the noise because of a smoothing effect. The improved brightness and the reduced noise can improve a frame (i.e., image data) quality as compared to the case where the TDI process is not performed.

It should be noted that, although the signal processing circuit 400 adds up four lines, the number of lines to be added up is not limited to four as long as two or more lines are added up. Also, although the signal processing circuit 400 integrates the four lines starting from the first line for the first eight frames, the present technology is not limited to this configuration. For example, in the case where the subject moves in the opposite direction, the signal processing circuit 400 need only integrate the four lines from the last line for the first eight frames.

Also, although there is one spacing region that is one line in size between the lines, it is possible to add up the lines having the same pattern by adding up every other frame such as the frames F1, F3, F5, and F7. It should be noted that, in the case where the line-to-line spacing region is changed to two or three lines in size, it is only necessary to add up every third or fourth frame.

Operation Example of the Solid-State Imaging Element

Figure 14:
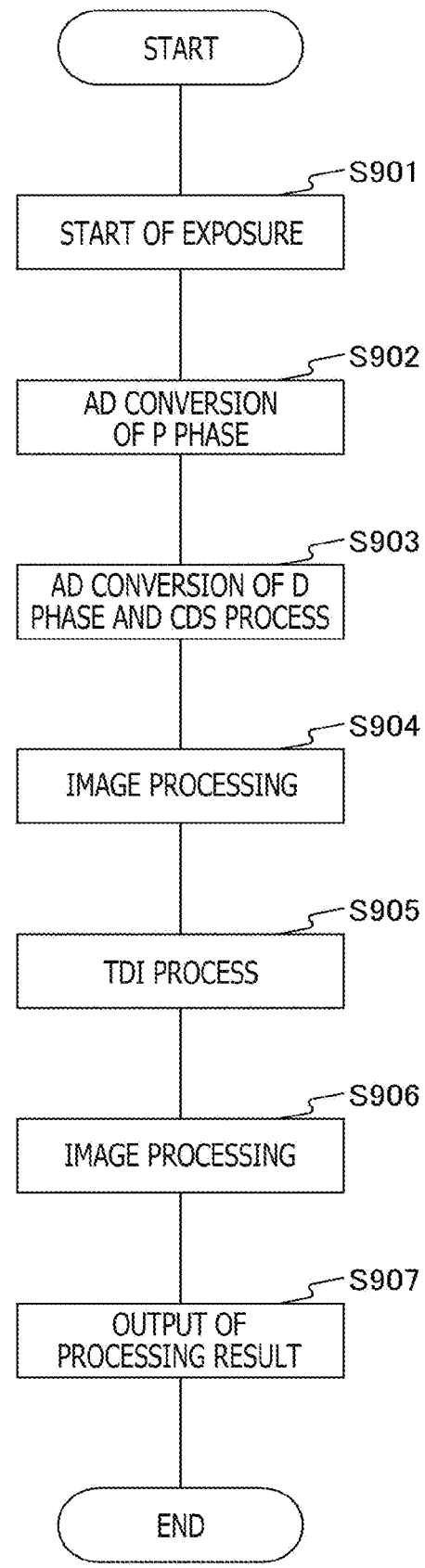
FIG. 14 is a flowchart illustrating an example of operation of the imaging system in the first embodiment of the present technology.

FIG. 14 is an example of a flowchart illustrating an example of operation of the solid-state imaging element 200 in the first embodiment of the present technology. This operation begins, for example, when a given application for capturing frames is executed.

The pixel drive circuit 252 in the solid-state imaging element 200 drives all the pixels and simultaneously starts exposure of these pixels (step S901). Control for simultaneously exposing all the pixels in this manner is called a global shutter scheme.

The ADC 310 converts the P phase level from analog to digital form immediately before the end of the exposure (step S902). Then, at the end of the exposure, the ADC 310 converts the D phase level from analog to digital form, and the arithmetic circuit 410 performs the CDS process (step S903).

The image processing circuit 260 performs given image processing on the frame that has been subjected to the CDS process (step 3904), and the arithmetic circuit 410 performs the TDI process (step S905). The image processing circuit 260 performs given image processing on the frame that has been subjected to the TDI process (step S906), and the output circuit 257 outputs the processing result (step S907). After step S907, the solid-state imaging element 200 terminates the process of capturing a frame. When two or more frames are captured successively, steps S901 to S907 are repeated synchronously with the vertical synchronizing signal VSYNC.

As described above, according to the first embodiment of the present technology, the plurality of photoelectric conversion elements 222 is arranged with the given spacing along the Y-axis direction, and the transistors are arranged therebetween, which makes it possible to expand the light-receiving area of the photoelectric conversion element 222 as compared to the case where no spacings are provided. This improves the pixel sensitivity.

2. Second Embodiment

In the above first embodiment, the reset transistor 224 is arranged in the pixel circuit 220 to initialize the floating diffusion layer 227. In this configuration, a circuit scale on the side of the light-receiving chip 201 increases as a result of increase in the number of pixels. The pixel circuit 220 of the second embodiment differs from that of the first embodiment in that the reset transistor 224 has been removed.

Figure 15:
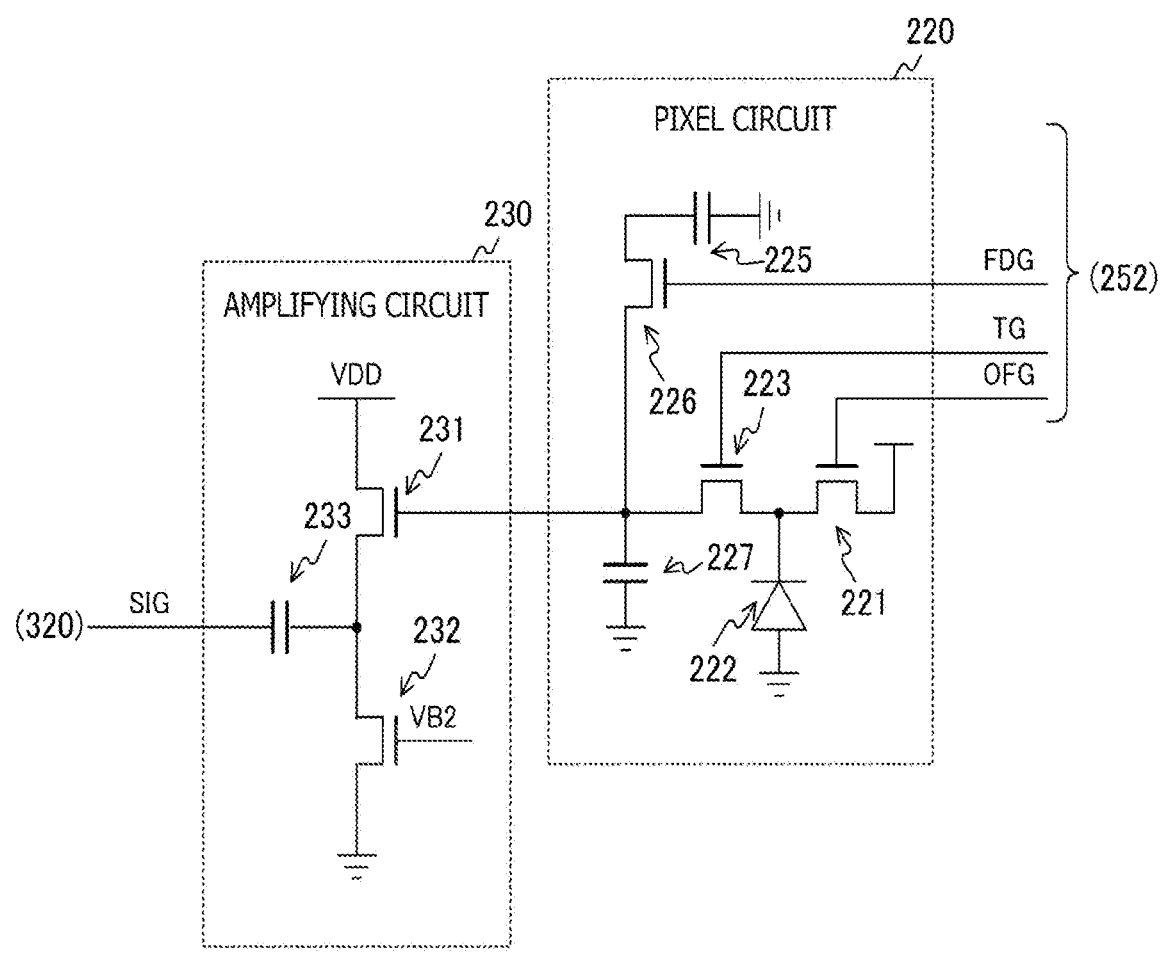
FIG. 15 is a circuit diagram illustrating examples of configurations of the pixel circuit and the amplifying circuit in a second embodiment of the present technology.

FIG. 15 is a circuit diagram illustrating examples of configurations of the pixel circuit 220 and the amplifying circuit 230 in the second embodiment of the present technology. The pixel circuit 220 of the second embodiment differs from that of the first embodiment in that the reset transistor 224 is not arranged. In the second embodiment, for example, the floating diffusion layer 227 is initialized as a result of the pixel drive circuit 252 turning ON the discharge transistor 221 and the transfer transistor 223. The removal of the reset transistor 224 can reduce the circuit scale of the light-receiving chip 201.

As described above, according to the second embodiment of the present technology, because the pixel drive circuit 252 initializes the floating diffusion layer 227 by turning ON the discharge transistor 221 and the transfer transistor 223, it is possible to remove the reset transistor 224. This can reduce the circuit scale of the light-receiving chip 201.

3. Third Embodiment

In the above first embodiment, the amplifying circuit 230 and other circuitry are added in the line-to-line spacing regions. In this configuration, the circuit scale on the side of the light-receiving chip 201 may increase as a result of increase in the number of pixels. The pixel circuit 220 of the second embodiment differs from that of the first embodiment in that the floating diffusion layer 227 is shared by the plurality of pixels.

Figure 16:
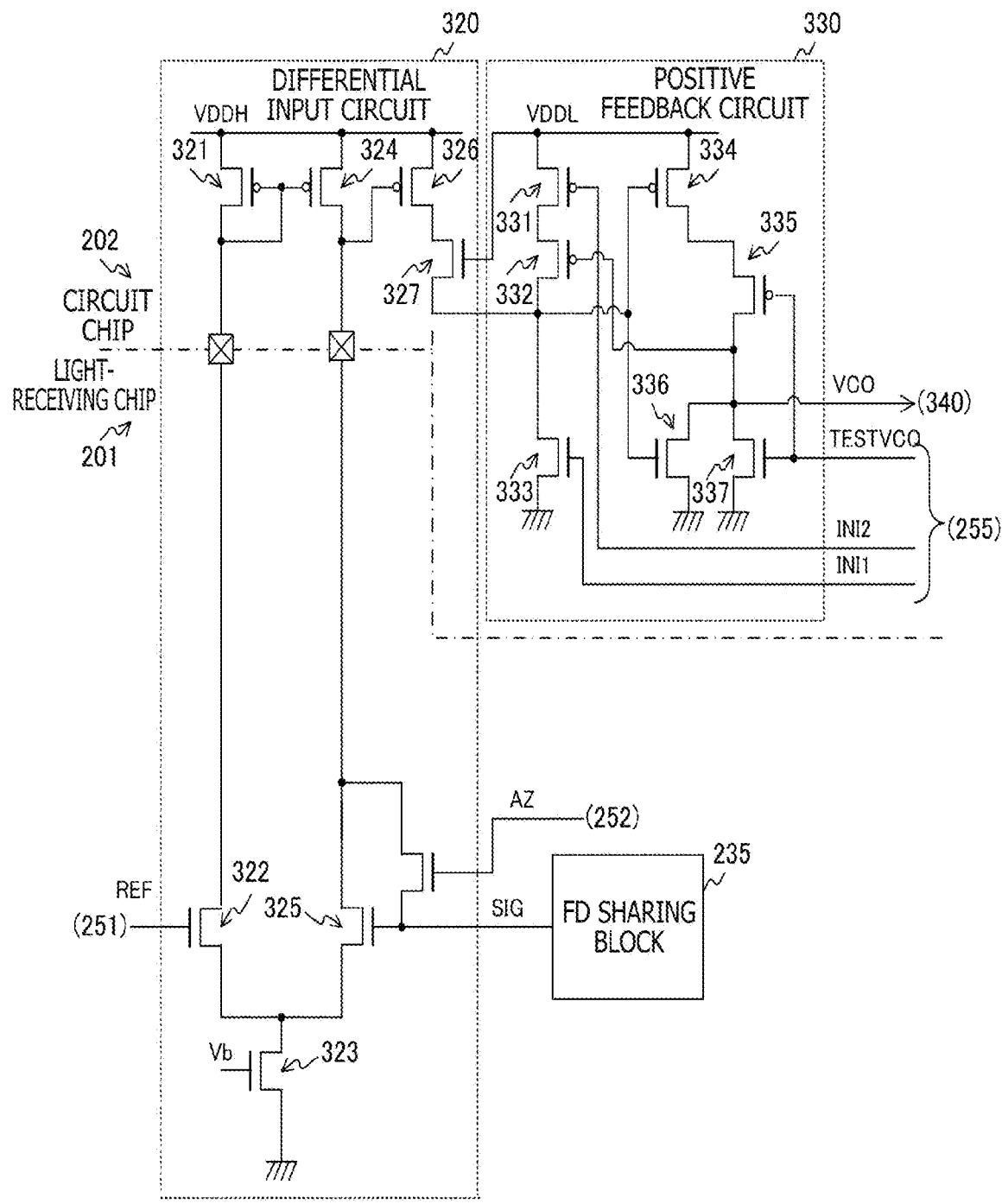
FIG. 16 is a circuit diagram illustrating examples of configurations of the differential input circuit, the positive feedback circuit, and an FD sharing block in a third embodiment of the present technology.

FIG. 16 is a circuit diagram illustrating examples of configurations of the differential input circuit 320, the positive feedback circuit 330, and an FD sharing block 235 in the third embodiment of the present technology. A plurality of pixels that shares the floating diffusion layer 227 is arranged in the FD sharing block 235. The FD sharing block 235 is connected to the ADC 310 that includes the differential input circuit 320 and the positive feedback circuit 330, on a one-to-one basis. That is, the ADC 310 is also shared by the plurality of pixels.

Figure 17:
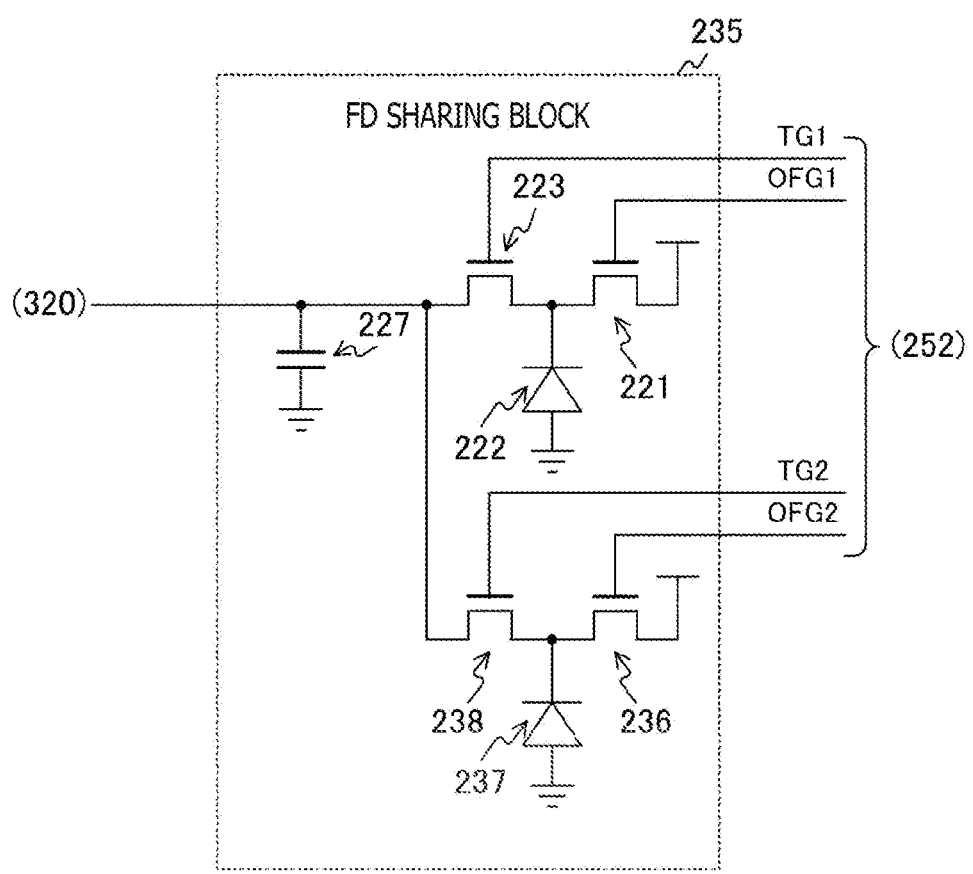
FIG. 17 is a circuit diagram illustrating an example of a configuration of the FD sharing block in the third embodiment of the present technology.

FIG. 17 is a circuit diagram illustrating an example of a configuration of the FD sharing block 235 in the third embodiment of the present technology. The FD sharing block 235 includes the discharge transistor 221 and a discharge transistor 236, the photoelectric conversion element 222 and a photoelectric conversion element 237, the transfer transistor 223 and a transfer transistor 238, and the floating diffusion layer 227.

A connection configuration with the discharge transistor 221, the photoelectric conversion element 222, the transfer transistor 223, and the floating diffusion layer 227 is similar to that of the first embodiment. It should be noted, however, that a transfer signal TG1 is input to the transfer transistor 223 and that a drive signal OFG1 is input to the discharge transistor 221.

The discharge transistor 236 discharges the charge accumulated in the photoelectric conversion element 227 according to a drive signal OFG2 from the pixel drive circuit 252. The photoelectric conversion element 237 generates the charge through photoelectric conversion.

The transfer transistor 238 transfers the charge from the photoelectric conversion element 237 to the floating diffusion layer 227 according to a transfer signal TG2 from the pixel drive circuit 252.

The circuit that includes the discharge transistor 221, the photoelectric conversion element 222, the transfer transistor 223, and the floating diffusion layer 227 functions as one pixel. Also, the circuit that includes the discharge transistor 236, the photoelectric conversion element 237, the transfer transistor 238, and the floating diffusion layer 227 also functions as one pixel. That is, the floating diffusion layer 227 is shared by two pixels. The sharing of the floating diffusion layer 227 by a plurality of pixels can reduce the circuit scale of the light-receiving chip 201 per pixel.

It should be noted that, although the floating diffusion layer 227 is shared by two pixels, the number of pixels that share the floating diffusion layer 227 can be three or more.

Figure 18:
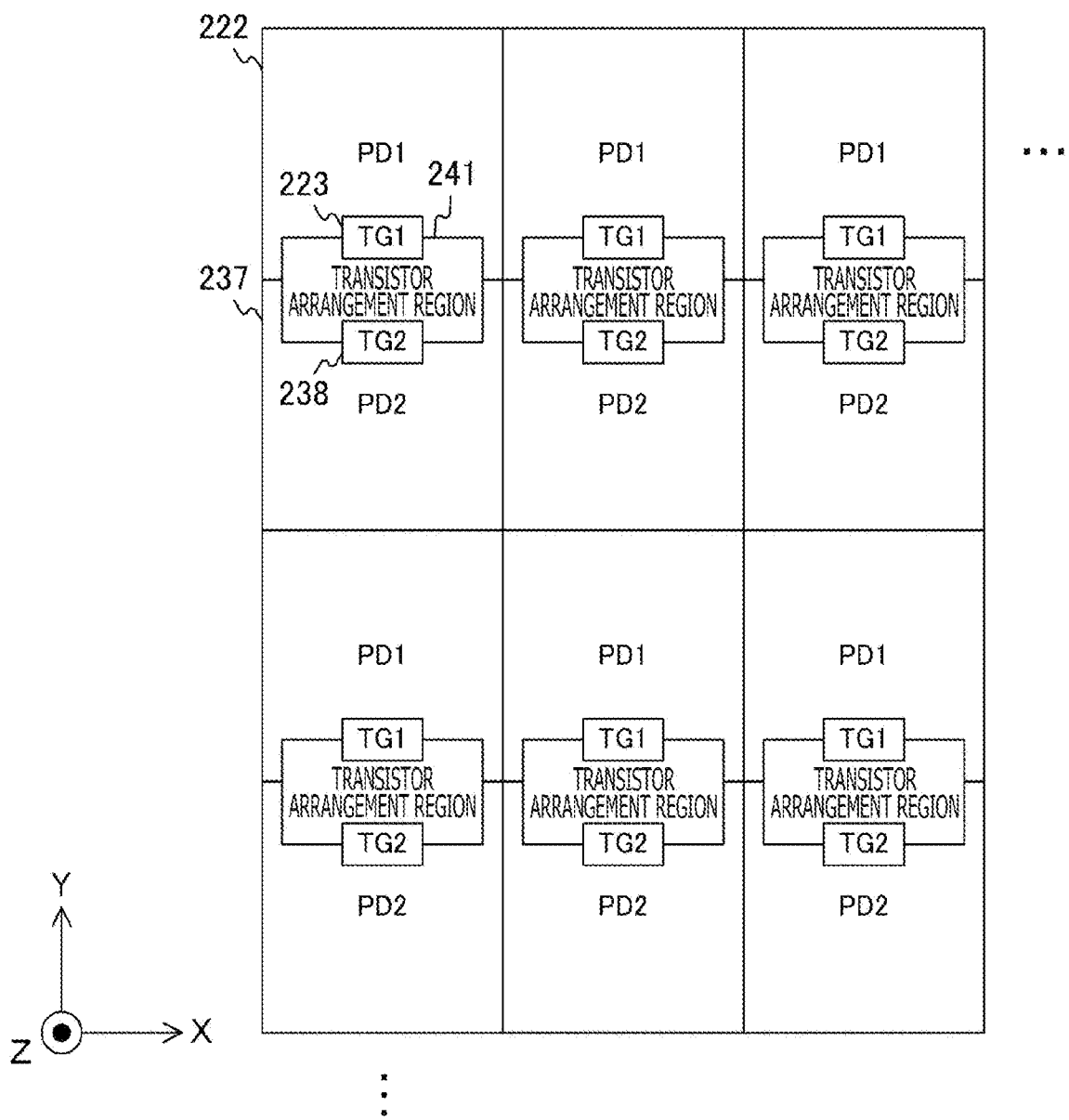
FIG. 18 is a plan view illustrating an example of layout of elements in a pixel in the third embodiment of the present technology.

FIG. 18 is a plan view illustrating an example of layout of elements in a pixel in the third embodiment of the present technology. The lines where N photoelectric conversion elements 222 are arranged in the X-axis direction are arranged with a spacing of one line in the Y-axis direction. The line where N floating diffusion layers 227 are arranged is arranged between the lines that include the photoelectric conversion elements 222. Then, the transistor arrangement region 241 is provided between the photoelectric conversion elements 222 and 237. The discharge transistor 221, the floating diffusion layer 227, and other elements are arranged in the transistor arrangement region 241. Also, the transfer transistor 223 is arranged between the transistor arrangement region 241 and the photoelectric conversion element 222, and the transfer transistor 238 is arranged between the transistor arrangement region 241 and the photoelectric conversion element 237.

It should be noted that, in the case where the number of pixels that share the floating diffusion layer 227 is three or more, it is only necessary to provide a spacing of two lines or more between the lines that include the photoelectric conversion elements 222. The larger the spacing between the lines that include the photoelectric conversion elements 222, the larger the size of the lower ADC 310 in the Y direction can be, which makes it easy to miniaturize the pixels in the X-axis direction.

As described above, according to the third embodiment of the present technology, the circuits that share the floating diffusion layers 227 are provided between the lines that include the floating diffusion layers 227, which makes it possible to reduce the circuit scale of the light-receiving chip 201 per pixel as compared to the case where the floating diffusion layers 227 are not shared.

It should be noted that the above embodiments illustrate examples for realizing the present technology, and matters in the embodiments and matters defining the invention in the claims are in correspondence with each other. Similarly, the matters defining the invention in the claims and matters in the embodiments of the present technology having the same names are in correspondence with each other. It should be noted, however, that the present technology is not limited to the embodiments and can be realized by making various modifications to the embodiments.

It should be noted that advantageous effects described in the present specification are merely illustrative and not restrictive, and that there may be other advantageous effects.

It should be noted that the present technology can also have the following configurations.

(1) A solid-state imaging element including:
a plurality of photoelectric conversion elements arranged along a given direction with a given spacing, a size of each of the photoelectric conversion elements along the given direction not exceeding the given spacing; and
a given number of transistors arranged between the plurality of photoelectric conversion elements and adapted to generate a signal commensurate with an amount of charge generated by any of the photoelectric conversion elements.

(2) The solid-state imaging element of feature (1), in which
any of the plurality of photoelectric conversion elements is arranged in a pixel circuit that generates a pixel signal, and
the given number of transistors are arranged in the pixel circuit and an amplifying circuit that amplifies the pixel signal.

(3) The solid-state imaging element of feature (2), in which
the given number of transistors include a pair of differential transistors that differentially amplify a given reference signal and the pixel signal,
the amplifying circuit includes a pair of transistors that are connected in series to a power supply, and a capacitance, and a gate of one of the pair of transistors is connected to a floating diffusion layer, and the capacitance is inserted between a connection point between the pair of transistors and a gate of one of the pair of differential transistors.

(4) The solid-state imaging element of feature (2) or (3) further including:
a floating diffusion layer arranged between the plurality of photoelectric conversion elements; and
a transfer transistor adapted to transfer charge from any of the plurality of photoelectric conversion elements to the floating diffusion layer, in which
the given number of transistors include a discharge transistor that discharges the charge from the floating diffusion layer, and
any of the plurality of photoelectric conversion elements, the floating diffusion layer, the transfer transistor, and the discharge transistor are arranged in the pixel circuit.

(5) The solid-state imaging element of any one of features (2) to (4), in which
the given number of transistors include a gain control transistor that controls an analog gain with respect to a voltage of the floating diffusion layer, and
the gain control transistor is arranged in the pixel circuit.

(6) The solid-state imaging element of feature (5), in which
the given number of transistors include a reset transistor that initializes the floating diffusion layer, and
the reset transistor is arranged in the pixel circuit.

(7) The solid-state imaging element of any one of features (1) to (6) further including:
an analog-digital conversion section adapted to convert a pixel signal commensurate with an amount of light received by each of the plurality of photoelectric conversion elements into a digital signal.

(8) The solid-state imaging element of feature (7) further including:
a time delay integration circuit adapted to perform a time delay integration process on the digital signal.

(9) The solid-state imaging element of feature (7) or (8), in which
the plurality of photoelectric conversion elements and the given number of transistors are arranged in a given light-receiving chip, and
the analog-digital conversion section is arranged in a given circuit chip.

(10) An imaging apparatus including:
a plurality of photoelectric conversion elements arranged along a given direction with a given spacing, a size of each of the photoelectric conversion elements along the given direction not exceeding the given spacing;
a given number of transistors arranged between the plurality of photoelectric conversion elements and adapted to generate a signal commensurate with an amount of charge generated by any of the photoelectric conversion elements; and
a signal processing circuit adapted to process a digital signal commensurate with an amount of light received by each of the plurality of photoelectric conversion elements.

REFERENCE SIGNS LIST

100: Imaging apparatus
110: Optical section
120: Storage section
130: Control section 140: Communication section
200: Solid-state imaging element
201: Light-receiving chip
202: Circuit chip
210: Pixel array section
211: Pixel block
212: Peripheral circuit
220: Pixel circuit
221, 236: Discharge transistor
222, 237: Photoelectric conversion element
223, 238: Transfer transistor
224: Reset transistor
225, 233: Capacitance
226: Gain control transistor
227: Floating diffusion layer
230: Amplifying circuit
231, 232, 322, 323, 325, 327, 328, 333, 336, 337: nMOS transistor
235: FD sharing block
240: Spacing region
241: Transistor arrangement region
251: DAC
252: Pixel drive circuit
253: Time-of-day code generation section
254: Pixel AD conversion section
255: Vertical scan circuit
256: Control circuit
257: Output circuit
260: Image processing circuit
300: Cluster
310: ADC
320: Differential input circuit
321, 324, 326, 331, 332, 334, 335: pMOS transistor
330: Positive feedback circuit
340: Latch control circuit
350: Latch circuit
360: Repeater section
400: Signal processing circuit
405, 422, 431, 433: Selector
410: Arithmetic circuit
420: TDI circuit
421, 432: Buffer
423: Adder
424, 435: Switch
430: CDS circuit
434: Subtractor
440: CDS frame memory
450: TDI frame memory
510: Belt conveyor
511: Subject

The invention claimed is:
1. A solid-state imaging element comprising:
photoelectric conversion elements arranged along a first direction with a spacing, a size of each of the photoelectric conversion elements along the first direction not exceeding the spacing; and
transistors arranged between the photoelectric conversion elements and configured to generate a signal commensurate with an amount of charge generated by any of the photoelectric conversion elements, wherein
the photoelectric conversion elements are arranged in a pixel circuit that generates a pixel signal,
the transistors are arranged in the pixel circuit and an amplifying circuit that amplifies the pixel signal,
the transistors include a first pair of transistors that differentially amplify a reference signal and the pixel signal,
the amplifying circuit includes a second pair of transistors that are connected in series to a power supply, and a capacitance, and
a gate of one of the second pair of transistors is connected to a floating diffusion layer, and the capacitance is inserted between a connection point between the second pair of transistors and a gate of one of the first pair of transistors.

2. The solid-state imaging element of claim 1, further comprising:
a floating diffusion layer arranged between the photoelectric conversion elements; and
a transfer transistor configured to transfer charge from any of the photoelectric conversion elements to the floating diffusion layer, wherein
the transistors include a discharge transistor that discharges the charge from the floating diffusion layer, and
any of the photoelectric conversion elements, the floating diffusion layer, the transfer transistor, and the discharge transistor are arranged in the pixel circuit.

3. An imaging apparatus comprising the solid-state imaging element according to claim 1.

4. The imaging apparatus of claim 3, further comprising:
a floating diffusion layer arranged between the photoelectric conversion elements; and
a transfer transistor configured to transfer charge from any of the photoelectric conversion elements to the floating diffusion layer, wherein
the transistors include a discharge transistor that discharges the charge from the floating diffusion layer, and
any of the photoelectric conversion elements, the floating diffusion layer, the transfer transistor, and the discharge transistor are arranged in the pixel circuit.

5. A solid-state imaging element comprising:
photoelectric conversion elements arranged along a first direction with a spacing, a size of each of the photoelectric conversion elements along the first direction not exceeding the spacing; and
transistors arranged between the photoelectric conversion elements and configured to generate a signal commensurate with an amount of charge generated by any of the photoelectric conversion elements, wherein
the photoelectric conversion elements are arranged in a pixel circuit that generates a pixel signal, and
the transistors are arranged in the pixel circuit and an amplifying circuit that amplifies the pixel signal,
transistors include a gain control transistor that controls an analog gain with respect to a voltage of a floating diffusion layer, and
the gain control transistor is arranged in the pixel circuit.

6. The solid-state imaging element of claim 5, wherein the transistors include a reset transistor that initializes the floating diffusion layer, and the reset transistor is arranged in the pixel circuit.

7. An imaging apparatus comprising the solid-state imaging element according to claim 5.

8. The imaging apparatus of claim 7, wherein the transistors include a reset transistor that initializes the floating diffusion layer, and the reset transistor is arranged in the pixel circuit.

9. A solid-state imaging element comprising:
photoelectric conversion elements arranged along a first direction with a spacing, a size of each of the photoelectric conversion elements along the first direction not exceeding the spacing; and transistors arranged between the photoelectric conversion elements and configured to generate a signal commensurate with an amount of charge generated by any of the photoelectric conversion elements;

an analog-digital conversion circuit configured to convert a pixel signal commensurate with an amount of light received by each of the photoelectric conversion elements into a digital signal; and a time delay integration circuit configured to perform a time delay integration process on the digital signal.

10. The solid-state imaging element of claim 9, wherein the photoelectric conversion elements and the transistors are arranged in a light-receiving chip, and the analog-digital conversion circuit is arranged in a circuit chip.

11. An imaging apparatus comprising the solid-state imaging element according to claim 9.

12. The imaging apparatus of claim 11, wherein the photoelectric conversion elements and the transistors are arranged in a light-receiving chip, and the analog-digital conversion circuit is arranged in a circuit chip.

\* \* \* \* \*